US008460561B2

(12) United States Patent
Katoh

(10) Patent No.: US 8,460,561 B2
(45) Date of Patent: Jun. 11, 2013

(54) CRYSTAL OSCILLATOR PIECE AND METHOD FOR MANUFACTURING THE SAME

(75) Inventor: Akiko Katoh, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 536 days.

(21) Appl. No.: 12/677,596

(22) PCT Filed: Sep. 12, 2008

(86) PCT No.: PCT/JP2008/066923
§ 371 (c)(1),
(2), (4) Date: Mar. 11, 2010

(87) PCT Pub. No.: WO2009/035155
PCT Pub. Date: Mar. 19, 2009

(65) Prior Publication Data
US 2010/0200543 A1 Aug. 12, 2010

(30) Foreign Application Priority Data

Sep. 13, 2007 (JP) ................................ 2007-237891

(51) Int. Cl.
*H03H 3/02* (2006.01)
(52) U.S. Cl.
USPC ...... 216/2; 216/41; 216/83; 216/99; 310/367; 310/370; 333/200; 29/25.35; 73/504.16; 331/156
(58) Field of Classification Search
USPC ..... 216/83, 41, 99, 2; 310/370, 367; 333/200; 29/25.35; 73/504.16; 331/156
See application file for complete search history.

(56) References Cited

U.S. PATENT DOCUMENTS

| 5,307,034 A | * | 4/1994 | Morita et al. ................. 333/187 |
| 2004/0085163 A1 | * | 5/2004 | Kikushima .................... 333/200 |
| 2006/0175288 A1 | * | 8/2006 | Aratake ........................... 216/41 |
| 2010/0084948 A1 | * | 4/2010 | Katoh et al. .................. 310/367 |

FOREIGN PATENT DOCUMENTS

| JP | 52-035592 A | | 3/1977 |
| JP | 60-214114 A | | 10/1985 |
| JP | 9-186548 A | | 7/1997 |
| JP | 2004200915 A | * | 7/2004 |
| JP | 2005-151423 A | | 6/2005 |

OTHER PUBLICATIONS

International Search Report of PCT/JP2008/066923, Dec. 9, 2008.

* cited by examiner

*Primary Examiner* — Lan Vinh
*Assistant Examiner* — David Kaufman

(57) ABSTRACT

The present invention provides a crystal oscillator piece in which the cross section of its vibrating tine, while not symmetrical in shape, has a principal axis that is oriented parallel to an X axis to suppress the generation of leakage vibration, and a method for manufacturing such a crystal oscillator piece. More specifically, the invention provides a crystal oscillator piece includes a vibrating tine having an upper surface, a lower surface having a larger width than the upper surface, a first side face, and a second side face, and a balance adjusting groove formed in the vibrating tine, wherein the first and second side faces are formed in sloping fashion so that the width of the vibrating tine gradually increases from the upper surface toward the lower surface, and the balance adjusting groove is formed in accordance with the sloping of the first and second side faces so that at least one of two dynamically perpendicular principal axes passing through a centroid on a cross section taken perpendicularly to a longitudinal direction of the vibrating tine becomes substantially parallel to the upper surface or the lower surface. The invention also provides a method for manufacturing such a crystal oscillator piece.

10 Claims, 22 Drawing Sheets

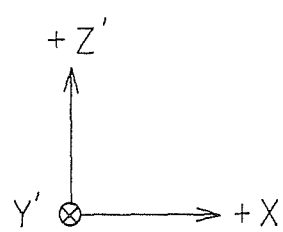

Fig. 4
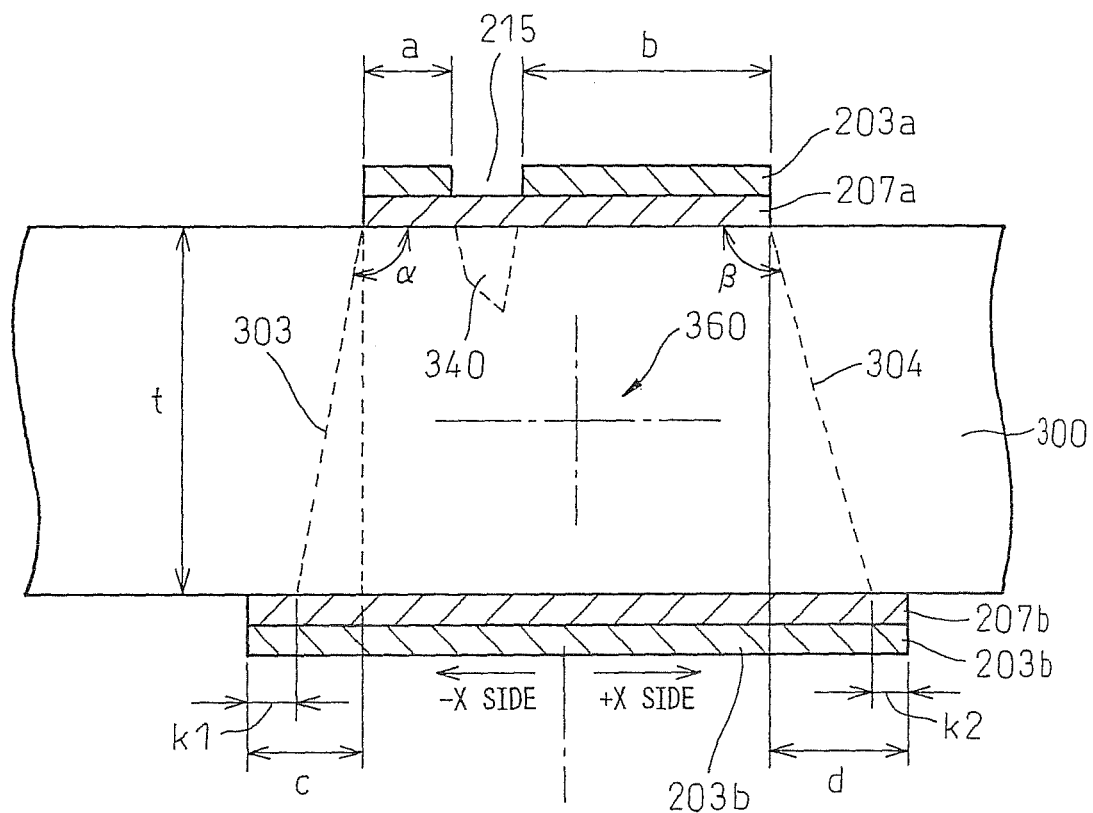
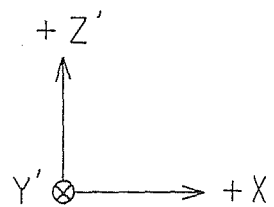

Fig.7
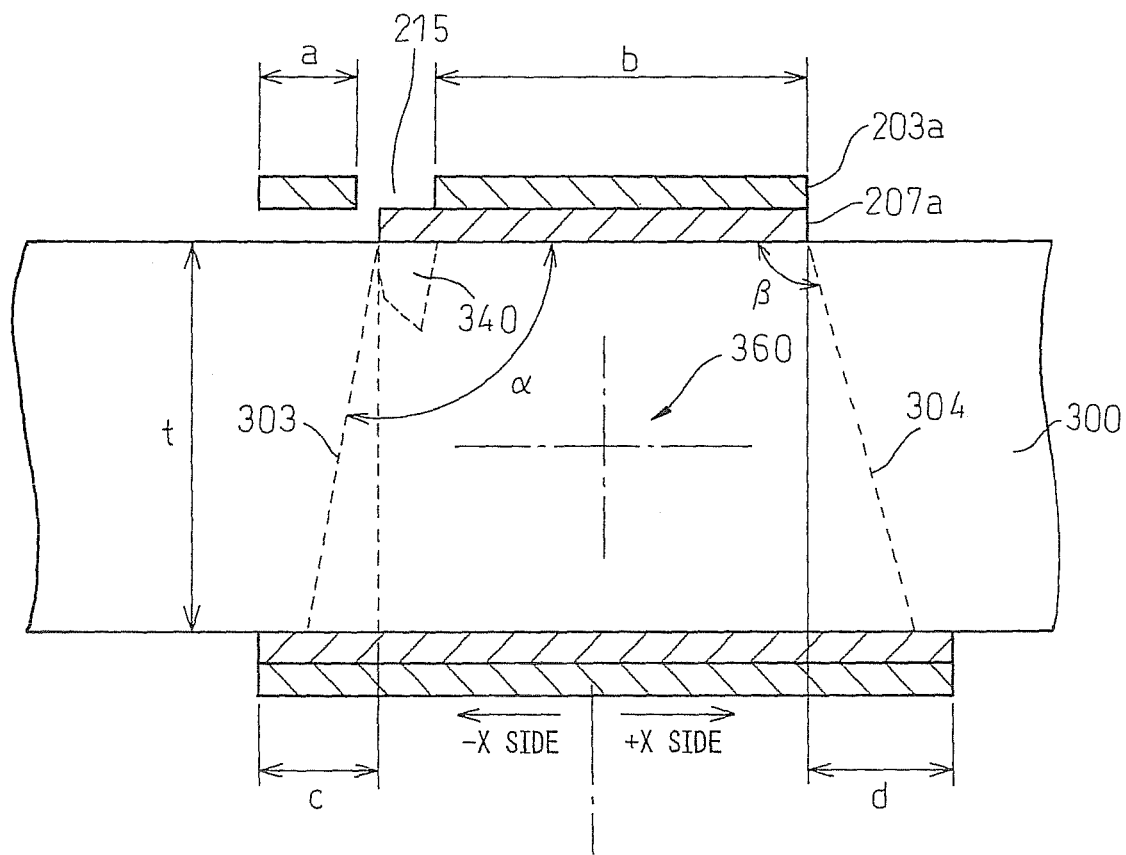
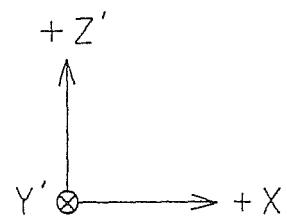

Fig.9
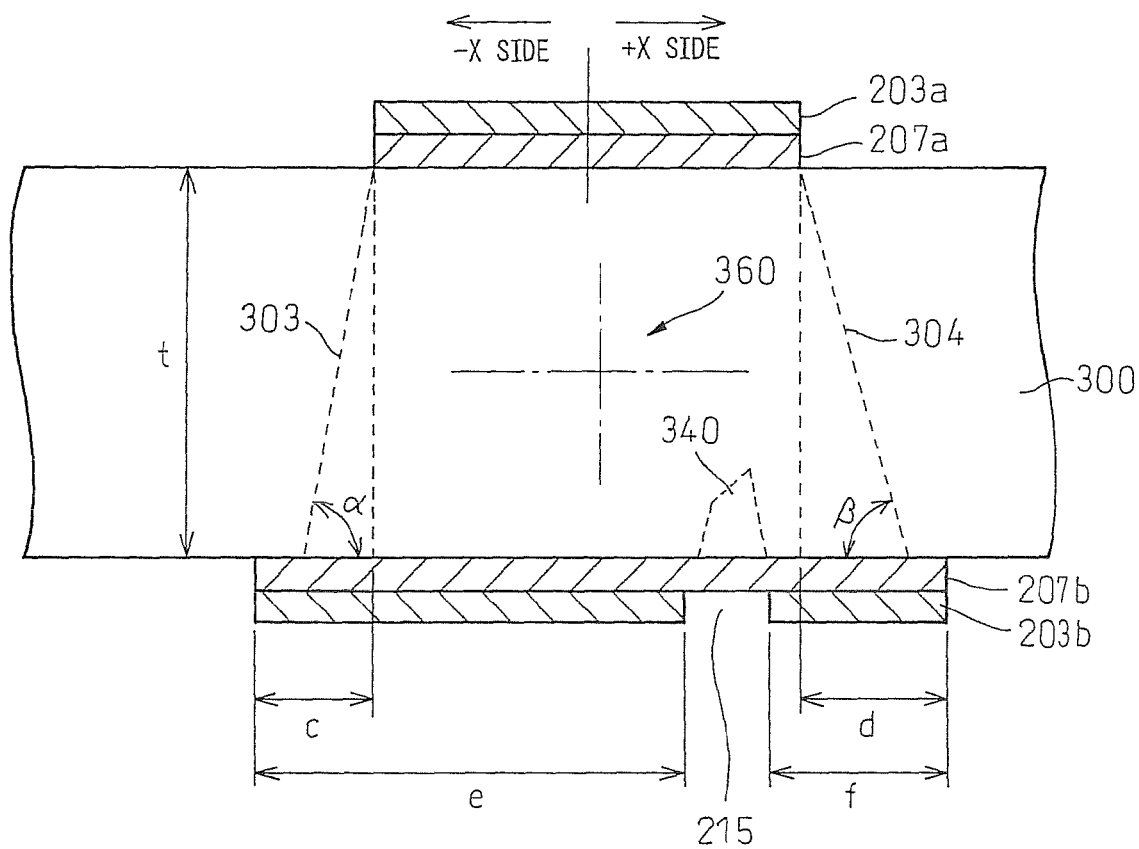
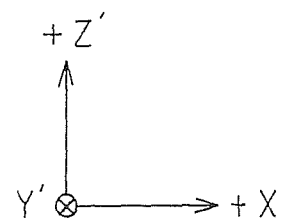

Fig.10
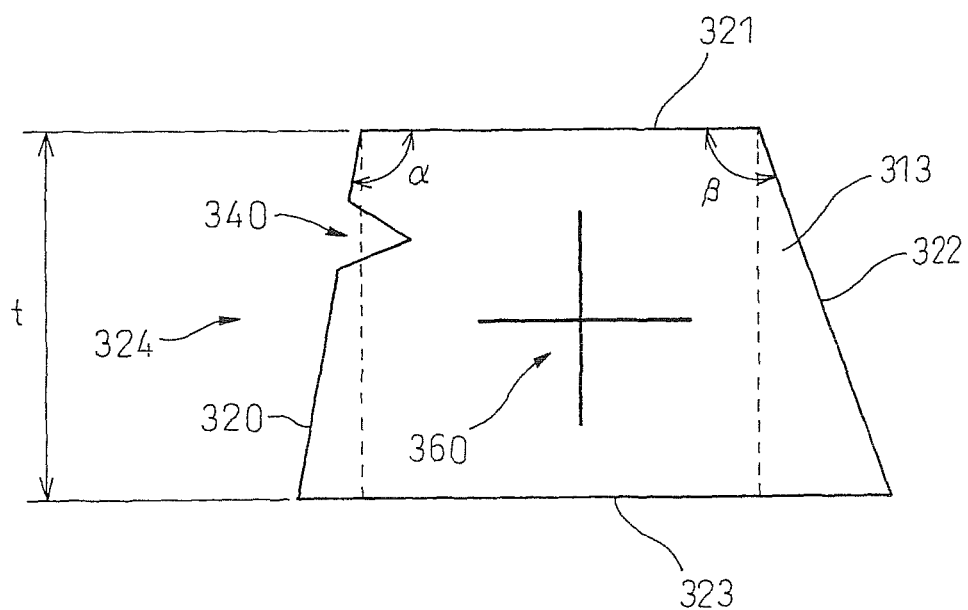
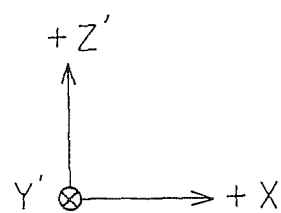

Fig.14
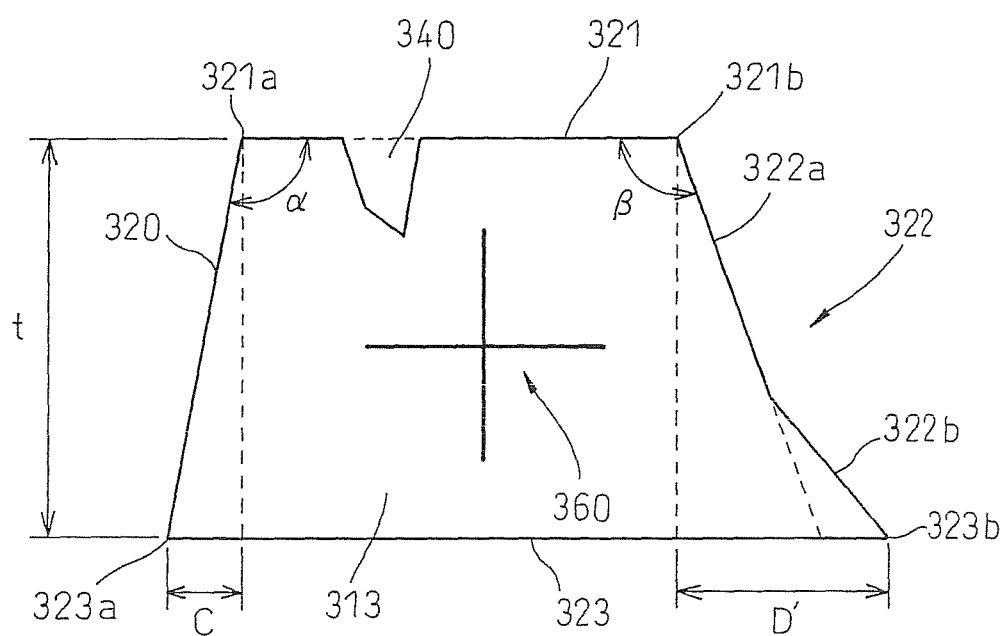
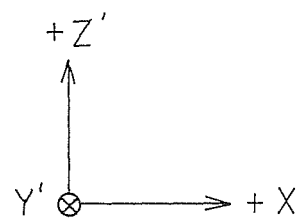

CRYSTAL OSCILLATOR PIECE AND METHOD FOR MANUFACTURING THE SAME

FIELD OF THE INVENTION

The present invention relates to a crystal oscillator piece and a method for manufacturing the same, and more particularly to a crystal oscillator piece that has a structure for suppressing the occurrence of leakage vibration known as out-of-plane vibration, and a method for manufacturing such a crystal oscillator piece.

BACKGROUND OF THE INVENTION

A tuning fork crystal oscillator used for a vibratory gyro, etc., is manufactured by the steps including cutting a crystal oscillator piece of a desired shape from a crystal wafer, forming electrodes for causing the crystal oscillator piece to oscillate, and packaging the crystal oscillator piece with the electrodes formed thereon into a container. In particular, the step of cutting the crystal oscillator piece from a crystal wafer is an important step because the shape of the crystal oscillator piece determines the frequency of vibration and greatly affects the device performance.

FIG. 15 is a diagram showing the crystallographic axes of a crystal oscillator piece.

As shown in FIG. 15, a crystal wafer is fabricated using, for example, a Z-piece obtained by cutting a crystal along a plane perpendicular to the Z axis of the crystal or a crystal wafer 100 obtained by rotating the Z-piece about the X axis by an angle of 0° to 15°. The crystallographic axes, after rotation about the X axis, are X, Y', and Z'. This means that the principal plane of the crystal wafer 100 is the X-Y' plane.

FIG. 16 is a diagram schematically showing the crystal oscillator piece 110 cut from the crystal wafer 100.

FIG. 16(a) is a schematic plan view of the crystal oscillator piece 110, FIG. 16(b) is a diagram showing one example of a cross-sectional view taken along line A-A' in FIG. 16(a), and FIG. 16(c) is a diagram showing another example of a cross-sectional view taken along line A-A' in FIG. 16(a).

The crystal oscillator piece 110 is made up of a support portion 111, a base portion 112, and vibrating tines 113. The vibrating tines 113 are the portions that vibrate. The vibrating tines 113 each have a width in the X axis direction, a length in the Y' axis direction, and a thickness in the Z' axis direction.

In the step of cutting the crystal oscillator piece 110 from the crystal wafer 100, a method utilizing photolithography and wet etching is employed since it can mass-produce small-sized crystal oscillator pieces with good accuracy and at low cost.

FIG. 17 is a diagram showing a method for manufacturing the crystal oscillator piece. FIG. 17 shows cross sections of the vibrating tines of the crystal oscillator piece.

First, as shown in FIG. 17(b), corrosion resistant metal films 200a and 200b having resistance to crystal etchants and photoresist films 201a and 201b overlying the respective corrosion resistant metal films 200a and 200b are formed on the upper and lower surfaces of the crystal wafer 100 prepared, as shown in FIG. 17(a), to a desired thickness.

Next, as shown in FIG. 17(c), the photoresist films 201a and 201b are exposed to radiation through two photomasks 205 and 206, respectively, that have oscillator patterns written thereon that perfectly overlay each other when placed facing each other.

Next, the photoresist films 201a and 201b are developed. Then, using the thus developed photoresist patterns as masks, the corrosion resistant metal films 200a and 200b are patterned, as shown in FIG. 17(d), thus forming etching masks 207a and 207b for crystal etching.

Next, the remaining photoresist films are removed. Thereafter, the crystal wafer 101 with the etching masks 207a and 207b formed on both surfaces thereof is immersed in an etching solution of hydrofluoric acid, and the portions of the crystal that are not covered with the etching masks 207a and 207b are dissolved from both surfaces, as shown in FIG. 17(e). After that, the etching masks 207a and 207b are removed, completing the fabrication of the crystal oscillator piece 110 such as shown in FIG. 16.

In another known method for manufacturing a crystal oscillator piece, an etching mask is patterned only on one surface, with the other surface completely covered with a corrosion resistant metal film, and the one surface is etched (for example, refer to patent document 1).

In still another known method for manufacturing a crystal oscillator piece, the etching mask pattern 207d on the lower surface is formed wider than the pattern 207c on the upper surface, as shown in FIG. 18, and etching is performed using the upper surface pattern 207c as the reference pattern (for example, refer to patent document 2).

FIG. 19 is a diagram explaining the direction of vibration of the crystal oscillator piece when it is used for a vibratory gyro.

FIG. 19(a) is a perspective view of the crystal oscillator piece of FIG. 16(a), FIG. 19(b) is a diagram showing one example of the direction of vibration in an A-A' cross section of FIG. 19(a), and FIG. 19(c) is a diagram showing another example of the direction of vibration in the A-A' cross section of FIG. 19(a).

As shown in FIG. 19(a), when using the tuning fork crystal oscillator for a vibratory gyro, flexural vibration in the X axis direction is used as driving vibration, and flexural vibration in the Z' axis direction is used as detection vibration which occurs when an angular velocity is applied. In this arrangement, in the absence of an applied angular velocity, the vibration in the Z' axis direction should not normally occur, as shown in FIG. 19(b).

However, in the tuning fork crystal oscillator manufactured by the prior art manufacturing method, there have been cases where a vibration component in the Z' axis direction is observed, as shown in FIG. 19(c), when actually no angular velocity is applied. The vibration component in the Z' axis direction arising from this oblique vibration is called the leakage vibration; since this vibration is indistinguishable from the detection vibration, there has been the problem that the S/N and temperature characteristics of the gyro degrade due to the leakage vibration.

In the case of tuning fork crystal oscillators for ordinary applications, the tuning fork vibration is likewise produced by using the flexural vibration in the X axis direction, and in this case also, there has been the problem that the oblique vibration containing the Z' direction component causes the crystal impedance to rise, leading to a degradation of the characteristics.

It is believed that crystal residual portions generated when fabricating the crystal oscillator piece by etching have some bearing on the oblique vibration. Since the crystal has etching anisotropy, the etch rate is different in different directions of the crystal. As a result, the side faces of the vibrating tines 113 of the crystal oscillator piece after etching are not perpendicular to the principal plane, but residual portions are left thereon forming angles.

For example, as shown in FIGS. 16(b) and 16(c), the cross-sectional shape of the crystal oscillator piece 110 is not precisely rectangular, but residual triangles or other shapes are formed on the +X and −X side faces in the Y'-Z' plane. FIG. 16(b) shows the cross-sectional shape after etching for a short period of time, and FIG. 16(c) shows the cross-sectional shape after etching for a long period of time.

If such residual portions are present, the driving vibration which should normally occur only in the X axis direction, as shown in FIG. 19(b), may be disrupted, depending on how the residual portions are formed, and the vibration occurs in the oblique direction by being accompanied by a component vibrating in the Z' axis direction, as shown in FIG. 19(c). This results in the generation of leakage vibration. The leakage vibration arising from such oblique vibration tends to occur rather often when the crystal oscillator piece is manufactured by the prior art method. There has therefore developed a need to suppress the oblique vibration and reduce the leakage vibration.

There is also a document that analyzes the relationship between the oblique vibration and the directions of the principal axes of the cross section of a crystal oscillator piece (for example, refer to non-patent document 1).

Further, it is known in the prior art to provide a piezoelectric device which is fabricated by forming grooves in the vibrating tines of a tuning fork crystal oscillator piece, with each groove (electric field forming groove) provided with electrodes for generating a prescribed electric field, thereby causing each vibrating tine to repeatedly generate flexural motion.

Patent document 1: Japanese Unexamined Patent Publication No. S52-035592 (Page 3, FIG. 3)
Patent document 2: Japanese Unexamined Patent Publication No. 2006-217497 (Page 5, FIG. 1)
Patent document 3: Japanese Unexamined Patent Publication No. 2004-007428 (FIG. 2)
Non-patent document 1: Motohiro FUJIYOSHI et al., IEICE Transactions, C Vol. J87-C, No. 9, p. 712

SUMMARY OF THE INVENTION

The relationship between the oblique vibration and the residual portions in the vibrating tine cross section will be investigated in detail below. The vibrating tine cross section here refers to the cross section taken perpendicularly to the longitudinal direction of the vibrating tine (i.e., the cross section taken along line A-A' in FIG. 16(a)), and corresponds to the X-Z' plane of the crystal.

Generally, when investigating the flexure of a beam or the like, the principal axes of the cross section are often considered. The principal axes of the cross section are two mutually perpendicular axes, and when a bending force is applied to the beam in the same direction as a principal axis, the beam bends in the same direction as the direction of the stress. On the other hand, when a bending force is applied in a direction different than the direction of the principal axis, the beam bends in a direction different than the direction in which the stress is applied.

In the case of a crystal oscillator, the bending force due to the piezoelectric effect is applied in the X axis direction. Therefore, if one of the principal axes coincides with the X axis, the vibration occurs in the X axis direction, and no leakage vibration results. On the other hand, if the principal axis is tilted away from the X axis toward the Z' axis, since the direction of the bending force does not coincide with the direction of the principal axis, oblique vibration containing a Z' axis component occurs, resulting in the generation of leakage vibration.

The orientations of the principal axes are determined by the cross-sectional shape of the beam (vibrating tine). As a simple example, in the case of a cross section having an axis of symmetry, the axis of symmetry and an axis perpendicular to it are the principal axes of the cross section. For example, in the case of a rectangular cross section, the lines that bisect the respective pairs of opposite sides are the principal axes.

If a crystal oscillator free from leakage vibration is to be obtained, it is required that one of its principal axes be parallel to the X axis. Since the principal axes are two mutually perpendicular axes, if there is an axis of symmetry parallel to the X or Z' axis in the cross section, then there exists a principal axis parallel to the X axis. That is, the requirement is that the cross-sectional shape be top-bottom or left-right symmetrical.

An investigation has been made to see whether a crystal oscillator piece having such an axis of symmetry can be obtained when the oscillator piece is manufactured in accordance with the prior art. As earlier described, when the crystal oscillator piece is manufactured by wet etching, residual portions are formed on the side faces of the vibrating tines. The principal axes of the cross section are therefore determined depending on how the residual portions are formed. When considering the principal axes of the cross section of the crystal oscillator piece, first it is necessary to consider how the residual portions are formed.

Since the residual shape varies depending on the etching time and etching conditions, it is not possible to generalize, but the process of formation is roughly the same; therefore, the process of residual formation will be described below based on the results observed from the experiment conducted by the present inventor.

FIG. 20 is a cross-sectional view showing the condition of FIG. 17(e) in enlarged detail to illustrate how the residual portions are formed on the vibrating tines of the crystal oscillator piece.

In FIG. 20, only one vibrating tine is shown, and the side face on the −X side of the crystallographic axis of the crystal is denoted as the first side face and the side face on the +X side as the second side face.

FIG. 20(a) shows the case where the etching time is relatively short. In this case, the residual portion is formed on the second side face, forming an angle of about 2° with respect to the Z' axis in regions where the depth from the principal faces (the upper and lower surfaces 113a and 113b) of the oscillator is relatively small and an angle of about 22° in regions located deeper from the principal faces of the oscillator. Though the depth varies depending on the etching time, the process is essentially the same for both the upper and lower surfaces 113a and 113b.

FIG. 20(b) shows the case where the etching time is relatively long. In this case, the residual portion forming the angle of about 22° and located deeper from the principal faces of the oscillator is etched away, and only the residual portion forming the angle of about 2° and located near the principal faces of the oscillator is left unetched.

In either case, the residual portion formed on the first side face is very small. However, when closely observed, the residual portion is formed with an angle of about 1° with respect to the Z' axis, as shown in FIGS. 20(a) and 20(b). The shape of the residual portion on the first side face is relatively unaffected by the etching time. The etching starts from the edges of the respective etching masks 207a and 207b, and proceeds on both sides independently of each other until the wafer is etched through.

The following point can be pointed out for the case where the crystal oscillator piece is manufactured by the prior art method that performs etching from both the upper and lower surfaces as previously shown in FIG. 17.

As shown in FIG. 21(a), if the etching mask 207a formed on the upper surface of the crystal wafer and the etching mask 207b on the lower surface are in perfect alignment, the cross section of the vibrating tine 113 of the crystal oscillator piece, after etching, is top-bottom symmetrical about an axis of symmetry parallel to the X axis. That is, the cross section of the vibrating tine 113 of the crystal oscillator piece has a principal axis 250 parallel to the X axis. In this case, leakage vibration does not occur since the direction of the bending force and the direction of the principal axis both coincide with the X axis.

If the etching mask 207a formed on the upper surface and the etching mask 207b on the lower surface are displaced relative to each other in the X axis direction, as shown in FIG. 21(b), the cross-sectional shape of the vibrating tine 113 of the crystal oscillator piece becomes top-bottom asymmetrical. That is, the cross-sectional shape of the vibrating tine 113 of the crystal oscillator piece does not have an axis of symmetry parallel to the X axis, and does not have an axis of symmetry parallel to the Z' axis. In this case, neither principal axis 250a is oriented parallel to the X axis. Since the direction of the bending force and the direction of the principal axis are not coincident, oblique vibration occurs, resulting in the generation of leakage vibration.

If a positional displacement, e, occurs between the etching masks 207a and 207b, as shown in FIG. 21(b), the corresponding positional displacement, e, occurs between the upper surface 113a and the lower surface 113b in the cross section of the vibrating tine 113, as shown in FIG. 22(a). The angle of displacement of the principal axis at this time is shown in FIG. 22(b). In FIG. 22(b), Xa indicates, of the two principal axes, the principal axis that is closer to the X axis, and the angle of displacement of the principal axis Xa relative to the X axis is denoted by $\gamma(°)$ ($\beta$<90). FIG. 23 shows the relationship between the angle of displacement, $\gamma(°)$, of the principal axis Xa relative to the X axis and the positional displacement, e, occurring between the etching masks 207a and 207b in the prior art manufacturing method.

In FIG. 23, the abscissa represents the positional displacement, e, between the upper etching mask 207a and the lower etching mask 207b, and the ordinate represents the angle of displacement, $\gamma(°)$, of the principal axis Xa relative to the X axis. The positional displacement, e, between the etching masks 207a and 207b is taken to be positive when the upper etching mask is displaced in the −X direction from the lower etching mask, and y is taken to be positive when the displacement is in the counterclockwise direction. As can be seen from the graph of FIG. 23, there is correlation between the lateral displacement, e, and the angle of displacement, y.

To address this, if the leakage vibration is to be reduced sufficiently so that satisfactory characteristics can be obtained, the upper etching mask and the lower etching mask must be registered with each other with submicron-order accuracy in the etching step, to produce the crystal oscillator piece having a top-bottom symmetrical shape such as shown in FIG. 21(a). However, even if a high-accuracy double-side alignment exposure apparatus is used, there is a limit to the upper/lower mask alignment accuracy that can be achieved, and this has led to the problem that the production yield is low.

On the other hand, if etching is performed only from one side or by using the upper surface pattern as the reference as shown in FIG. 18, the problem of the positional displacement between the upper etching mask and the lower etching mask does not arise. However, if the crystal oscillator piece is manufactured by such a method, the cross section becomes left-right asymmetrical and does not have a principal axis parallel to the X axis, because the angle of the residual portion formed on one side face is different from the angle of the residual portion formed on the other side face. As a result, oblique vibration occurs in the crystal oscillator piece, resulting in the generation of leakage vibration. While this manufacturing method can consistently produce oscillator pieces of uniform quality, and is therefore effective in achieving resonant frequency stability, the method is not suited for the purpose of achieving an oscillator piece substantially free from leakage vibration.

In this way, the prior art method has had the problem that it is difficult to consistently produce a crystal oscillator piece whose vibrating tine cross section is top-bottom or left-right symmetrical.

Further, while it is known to provide electric field forming grooves in the vibrating tines of a tuning fork crystal oscillator piece, it is not known in the prior art to provide balance adjusting grooves for balancing out the residual portions.

It is an object of the present invention to provide a crystal oscillator piece that can solve the above-described problem of the prior art, and a method for manufacturing such a crystal oscillator piece.

It is another object of the present invention to provide a crystal oscillator piece in which the cross section of its vibrating tine, while not symmetrical in shape, has a principal axis that is oriented parallel to the X axis to suppress the generation of leakage vibration, and a method for manufacturing such a crystal oscillator piece.

It is a further object of the present invention to provide, by ingeniously designing the etching masks and the etching method used in the step of etching a crystal wafer from both the upper and lower surfaces thereof, a crystal oscillator piece manufacturing method capable of consistently manufacturing a crystal oscillator piece in which the cross section of its vibrating tine, while not symmetrical in shape, has a principal axis that is oriented parallel to the X axis to suppress the generation of leakage vibration.

A crystal oscillator piece according to the present invention is fabricated by etching from a crystal wafer, and includes a vibrating tine having an upper surface, a lower surface having a larger width than the upper surface, a first side face, and a second side face, and a balance adjusting groove formed in the vibrating tine, wherein the first and second side faces are formed in sloping fashion so that the width of the vibrating tine gradually increases from the upper surface toward the lower surface, and the balance adjusting groove is formed in accordance with the sloping of the first and second side faces so that at least one of two dynamically perpendicular principal axes passing through a centroid on a cross section taken perpendicularly to a longitudinal direction of the vibrating tine becomes substantially parallel to the upper surface or the lower surface.

Preferably, in the crystal oscillator piece according to the present invention, the balance adjusting groove is formed in the upper surface or the lower surface, and preferably, the balance adjusting groove is formed so as to satisfy the relationship when $\alpha<\beta$, A<B, and when $\alpha>\beta$, A>B where $\alpha$ is the angle that the first side face makes with a groove forming surface in which the balance adjusting groove is formed, $\beta$ is the angle that the second side face makes with the groove forming surface, A is the distance from the balance adjusting groove to the first side face, and B is the distance from the balance adjusting groove to the second side face.

According to the above configuration, the oscillator piece can always be made to have the same external shape, and the principal axis displaced from the proper direction can be adjusted by the balance adjusting groove to become parallel to the X axis of the crystal. Displacement can only occur in the position of the balance adjusting groove, and since the effect that any positional displacement of the balance adjusting groove will have on the tilting of the principal axis is very small compared with the effect caused by the upper/lower surface displacement in the prior art, the leakage vibration can be reduced to a negligibly small level.

Preferably, in the crystal oscillator piece according to the present invention, the balance adjusting groove is formed within the groove forming surface.

According to the above configuration, if the balance adjusting groove is displaced from its design position, since the volume of the balance adjusting groove is always the same, its effect on the orientation of the principal axis is small enough to be almost negligible, and a crystal oscillator piece in which the generation of leakage vibration is suppressed can thus be achieved.

Preferably, in the crystal oscillator piece according to the present invention, the balance adjusting groove is formed in such a manner as to overlap from the groove forming surface into the first side face or the second side face.

According to the above configuration, the balance adjusting groove can be formed even when the size of the oscillator is small so that the balance adjusting groove cannot be accommodated within the vibrating tine. In this case, the effect that the positional displacement of the groove will have on the tilting of the principal axis is larger than when the balance adjusting groove is accommodated within the vibrating tine, but still the effect of the positional displacement can be kept of less than the effect caused by the upper/lower surface displacement in the prior art.

Preferably, in the crystal oscillator piece according to the present invention, a plurality of such balance adjusting grooves are formed.

Further, preferably in the crystal oscillator piece according to the present invention, an electric field forming groove is formed in at least either one of the upper and lower surfaces.

Preferably, in the crystal oscillator piece according to the present invention, the electric field forming groove is formed so as to also function as the balance adjusting groove.

A method for manufacturing a crystal oscillator piece according to the present invention comprises an external shape forming step for forming a vibrating tine having an upper surface, a lower surface having a larger width than the upper surface, a first side face, and a second side face by etching a crystal wafer in sloping fashion so that the width of the vibrating tine gradually increases from the upper surface toward the lower surface, and a groove forming step for forming a balance adjusting groove by etching the vibrating tine in accordance with the sloping of the first and second side faces so that at least one of two dynamically perpendicular principal axes passing through a centroid on a cross section taken perpendicularly to a longitudinal direction of the vibrating tine becomes substantially parallel to the upper surface or the lower surface.

Preferably, in the external shape forming step in the method for manufacturing the crystal oscillator piece according to the present invention, an external shape defining upper etching mask is formed on the upper surface of the crystal wafer, and an external shape defining lower etching mask having a larger width than the external shape defining upper etching mask is formed on the lower surface of the crystal wafer, and preferably, the external shape defining upper etching mask and the external shape defining lower etching mask are formed so as to satisfy the relationship $$c > t \times \tan(\alpha - 90°)$$

$$d > t \times \tan(\beta - 90°)$$

where c is the length of a first protruding portion by which the external shape defining lower etching mask protrudes relative to the external shape defining upper etching mask from a position corresponding to an upper side edge of the first side face, d is the length of a second protruding portion by which the external shape defining lower etching mask protrudes relative to the external shape defining upper etching mask from a position corresponding to an upper side edge of the second side face, t is the thickness of the crystal wafer, $\alpha$ is an etching angle at the first side face, and $\beta$ is an etching angle at the second side face.

According to the above configuration, when the residual portion on the first side face is formed at an angle $\alpha$ relative to the groove forming surface, since the lower etching mask is made longer than the upper etching mask by an amount larger than $t \times \tan(\alpha - 90°)$, only the sloping face etched from the upper surface is formed as the first side face; in this way, a residual portion of a predetermined shape can always be formed on the first side face. Similarly, since only the sloping face etched from the upper surface is formed as the second side face, a residual portion of a predetermined shape can always be formed on the second side face. Accordingly, the oscillator can always be made to have the same external shape without being affected by an alignment error between the upper and lower etching masks. Further, since the etching angles $\alpha$ and $\beta$ are not equal to each other, initially neither principal axis of the cross section is oriented parallel to the X axis of the crystal, but by providing the balance adjusting groove, one of the principal axes can be made parallel to the X axis. An alignment error can only occur in the position of the balance adjusting groove, and if such an alignment error does occur, the tilting of the principal axis caused by the alignment error is much smaller than the tilting of the principal axis caused by the upper/lower surface alignment error that can occur in the prior art method, and thus, a crystal oscillator piece free from leakage vibration can be obtained in a stable manner.

Preferably, in the method for manufacturing the crystal oscillator piece according to the present invention, when the accuracy of alignment between the external shape defining upper etching mask and the external shape defining lower etching mask is $\pm p$, the external shape defining upper etching mask and the external shape defining lower etching mask are formed so as to satisfy the relationship $$c = t \times \tan(\alpha - 90°) + k1$$

$$d = t \times \tan(\beta - 90°) + k2$$

$$k1 > p \text{ and } k2 > p.$$

According to the above configuration, since the amounts of mask offset, k1 and k2, are each set to a value larger than the mask alignment accuracy p, even when a positional displacement occurs between the upper and lower etching masks due to an alignment error of the apparatus, a single sloping face etched from the upper surface is formed on the first side face, and thus a residual portion of a predetermined shape is always formed on the first side face. Similarly, one or two sloping faces etched from the upper surface are formed on the second side face, and a residual portion of a predetermined shape is always formed on the second side face. Accordingly, the external shape is always identical, and is thus unaffected by the upper/lower surface displacement.

Preferably, in the groove forming step in the method for manufacturing the crystal oscillator piece according to the present invention, a groove defining etching mask having a groove forming opening for forming the balance adjusting groove is formed on at least either one of the upper and lower surfaces, and preferably, the groove defining etching mask is formed so as to satisfy the relationship when $\alpha<\beta$, $a<b$, and when $\alpha>\beta$, $a>b$ where a is the distance from the groove forming opening to the first side face, and b is the distance from the groove forming opening to the second side face.

Further, preferably in the method for manufacturing the crystal oscillator piece according to the present invention, when a surface in which the balance adjusting groove is formed is designated as a groove forming surface, the balance adjusting groove is formed within the groove forming surface.

According to the above configuration, since the balance adjusting groove is formed within the vibrating tine, if the balance adjusting groove is displaced from its design position, since the volume of the groove does not change, the effect of the positional displacement is small and the leakage vibration is held to a low level.

Further, preferably in the method for manufacturing the crystal oscillator piece according to the present invention, when a surface in which the balance adjusting groove is formed is designated as a groove forming surface, the balance adjusting groove is formed in such a manner as to overlap from the groove forming surface into the first side face or the second side face.

According to the above configuration, the balance adjusting groove can be formed even when the size of the oscillator is small so that the balance adjusting groove cannot be accommodated within the vibrating tine. In this case, the effect that the positional displacement of the groove will have on the tilting of the principal axis is larger than when the balance adjusting groove is accommodated within the vibrating tine, but still the effect of the positional displacement can be kept of less than the effect caused by the upper/lower surface displacement in the prior art.

According to the crystal oscillator manufacturing method of the present invention, since the external shape is unaffected by the etching mask displacement, and the balance is adjusted by the balance adjusting groove substantially unaffected by the positional displacement, it becomes possible to achieve a crystal oscillator piece in which the leakage vibration is reduced to a negligibly small level.

BRIEF DESCRIPTION OF THE DRAWINGS

FIG. 4 is an enlarged view of one of vibrating tines in the condition of FIG. 3(b).

FIG. 7 is a diagram explaining how the vibrating tine shown in FIG. 6 is fabricated.

FIG. 9 is a diagram explaining how the vibrating tine shown in FIG. 8 is fabricated.

FIG. 10 is a diagram showing yet another crystal oscillator piece according to the present invention.

FIG. 14 is a diagram showing yet another alternative crystal oscillator piece according to the present invention.

DETAILED DESCRIPTION OF THE PREFERRED EMBODIMENT

A crystal oscillator piece according to the present invention and a method for manufacturing the same will be described below with reference to the drawings. It should, however, be noted that the technical scope of the present invention is not limited to the specific embodiments described herein, but extends to the inventions described in the appended claims and their equivalents. The crystal oscillator piece according to the present invention is characterized by the cross-sectional shape of its vibrating tine; therefore, the following description deals mainly with the cross-sectional shape of the vibrating tine of the crystal oscillator piece.

FIG. 1 is a diagram showing the crystal oscillator piece according to the present invention.

Figure 1A:
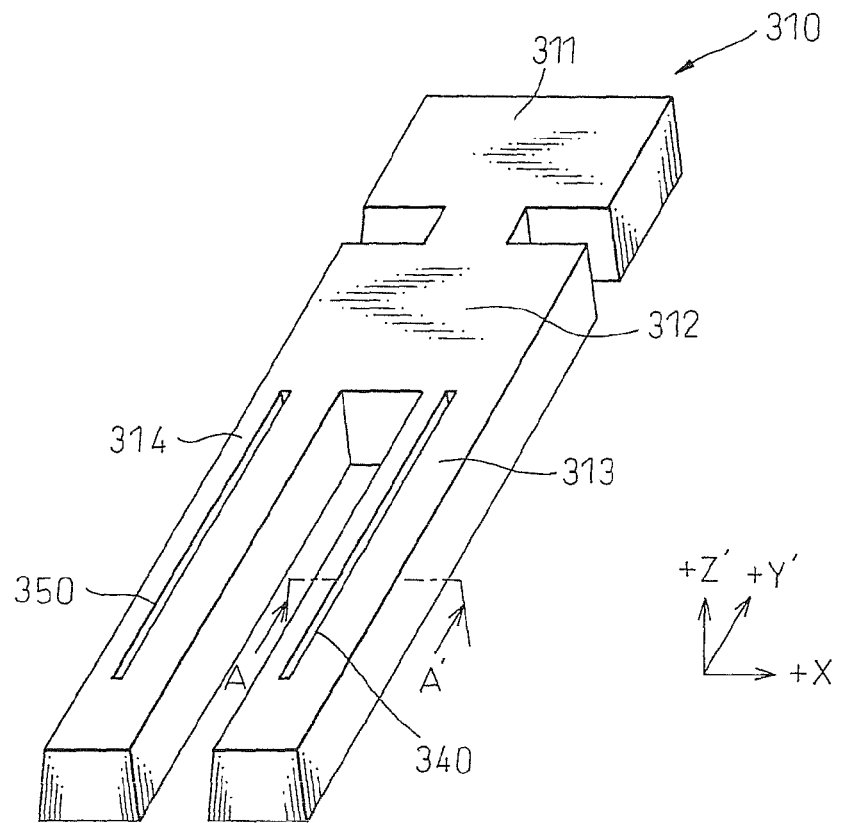
FIG. 1(a) is a perspective view of a crystal oscillator according to the present invention.
Figure 1B:
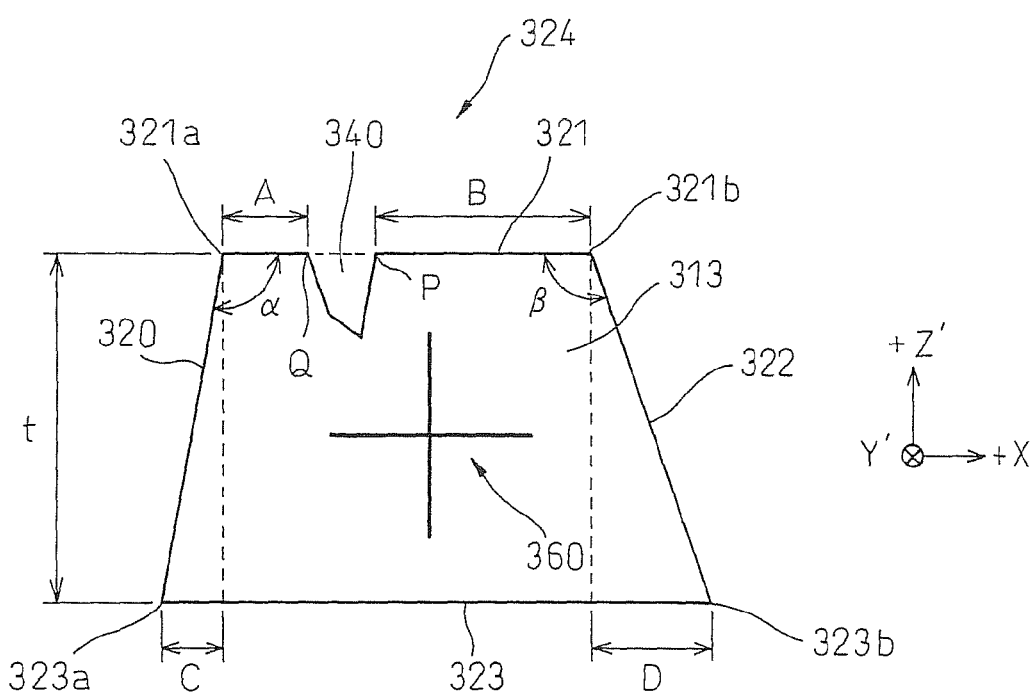
FIG. 1(b) is an enlarged view of a cross section taken along line AA° in FIG. 1(a).

FIG. 1(a) shows a perspective view of the crystal oscillator, and FIG. 1(b) is an enlarged view of a cross section taken along line AA' in FIG. 1(a).

As shown in FIG. 1(a), the crystal oscillator piece 310 according to the present invention comprises a support portion 311, a base portion 312, a first vibrating tine 313, and a second vibrating tine 314. A first balance adjusting groove 340 is formed in the first vibrating tine 313, and a second balance adjusting groove 350 in the second vibrating tine.

As shown in FIG. 1(b), the first vibrating tine 313 of the crystal oscillator piece 310 has an upper surface 321 and a lower surface 323 having different widths, a first side face 320 formed by a single sloping face, and a second side face 322 formed by a single sloping face. The width of the upper surface 321 is made smaller than that of the lower surface 323.

Let C denote the relative difference between an upper side edge 321a of the first side face and a lower side edge 323a of the first side face as measured along the width direction (the X axis direction), D the relative difference between an upper side edge 321b of the second side face and a lower side edge 323b of the second side face as measured along the width direction, α the etching angle at the first side face, β the etching angle at the second side face, and t the thickness of the first vibrating tine 313; then, the following two relationships hold.

$$C = t \times \tan(\alpha - 90°)$$

$$D = t \times \tan(\beta - 90°)$$

If $\alpha < \beta$, the balance adjusting groove 340 formed in the upper surface 321 is located nearer to the first side face 320. That is, A<B, where A is the distance from the upper side edge 321a of the first side face to a first-side-face-side edge Q of the balance adjusting groove 340 and B the distance from the upper side edge 321b of the second side face to a second-side-face-side edge P of the balance adjusting groove 340. When the first vibrating tine 313 is thus formed, one of the dynamically perpendicular two principal axes 360 passing through a centroid on a cross section taken perpendicularly to the longitudinal direction of the vibrating tine 313 is oriented substantially parallel to the upper surface 321. The phrase "substantially parallel" means that the degree of parallelism is just high enough that only leakage vibration of a degree that does not affect the characteristics can occur.

In the crystal oscillator piece 310 manufactured as shown in FIG. 1, almost no leakage vibration occurred even when the balance adjusting grooves 340 and 350 were displaced by 1 to 2 μm from their design positions. This compares favorably with the prior art method where substantial leakage vibration occurs when there is a displacement of approximately the same degree between the upper and lower surfaces.

Next, one example of the method for manufacturing the crystal oscillator piece according to the present invention will be described with reference to FIGS. 2 and 3.

Figure 2A:
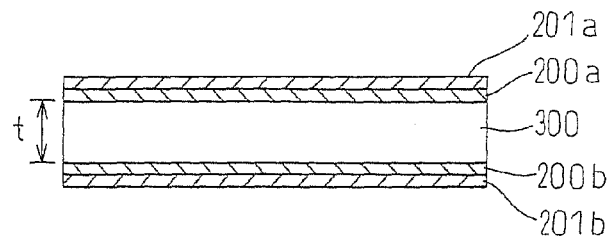
FIGS. 2(a) to 2(d) are process diagrams in cross section (part 1) showing the manufacturing steps of the crystal oscillator piece according to the present invention.

First, as shown in FIG. 2(a), corrosion resistant metal films 200a and 200b are formed by such means as sputtering, evaporation, or plating on the upper and lower surfaces of a crystal wafer 300 prepared to a thickness t. The corrosion resistant metal films 200a and 200b can each be formed using Cr for the base layer and Au or the like for the overlayer. Photoresist films 201a and 201b are applied over the surfaces of the respective corrosion resistant metal films 200a and 200b.

Figure 2B:
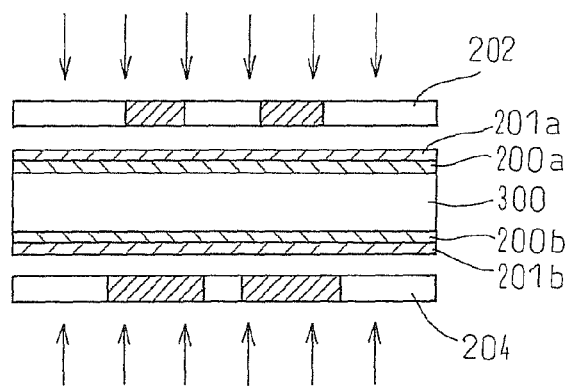

Next, as shown in FIG. 2(b), external shape defining upper and lower photomasks 202 and 204 are aligned with respect to each other using a double-side alignment apparatus, and the photoresist films 201a and 201b are exposed to radiation through the two photomasks 202 and 204.

Figure 2C:
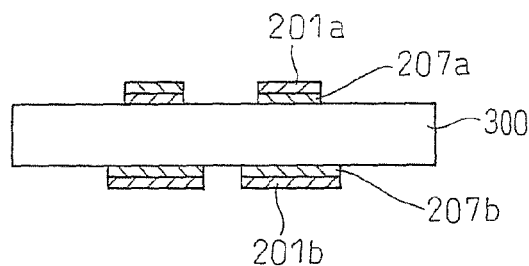

Next, as shown in FIG. 2(c), the photoresist films 201a and 201b are developed, and using the thus developed photoresist patterns as masks, the corrosion resistant metal films 200a and 200b are patterned in the shape of the oscillator, thus forming etching masks 207a and 207b of corrosion resistant metal films.

After that, the photoresist films 201a and 201b are removed, and photoresist films 209 are applied over the upper and lower surfaces of the crystal wafer on which the external shape defining etching masks have been formed.

Figure 2D:
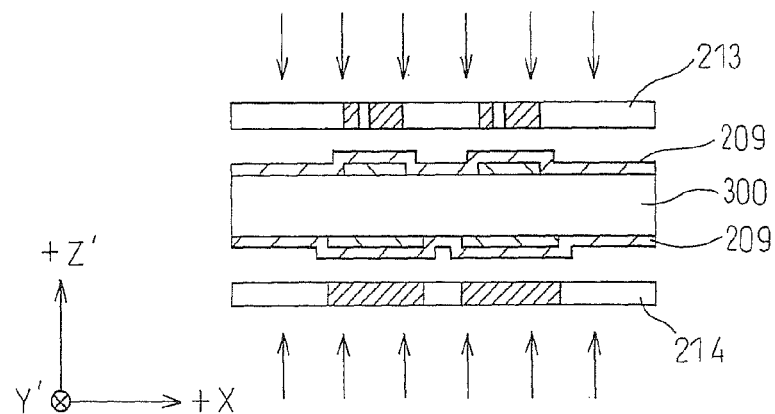

Next, as shown in FIG. 2(d), the respective photoresist films 209 are exposed to radiation through two photomasks, i.e., an upper surface groove defining photomask 213 and a lower surface groove defining photomask 214.

Figure 3A:
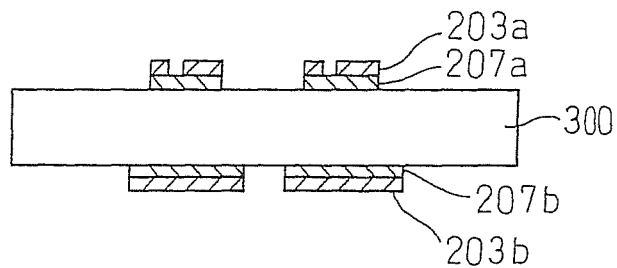
FIGS. 3(a) to 3(e) are process diagrams in cross section (part 2) showing the manufacturing steps of the crystal oscillator piece according to the present invention.

Next, as shown in FIG. 3(a), the exposed photoresist films 209 are developed, thus forming groove defining resist patterns 203a and 203b on the external shape defining etching masks 207a and 207b, respectively.

Figure 3B:
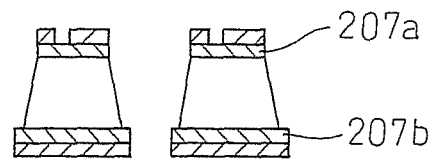

Next, as shown in FIG. 3(b), the crystal wafer 300, with the etching masks 207a and 207b of corrosion resistant metal films and the groove defining resist patterns 203a and 203b formed on both surfaces thereof, is immersed in a hydrofluoric-acid-containing etching solution, and the portions of the crystal that are not covered with the etching masks 207a and 207b of corrosion resistant metal films are dissolved away. The etching in this case is performed at least until the ridges formed midway on the first and second side faces 320 and 322 as shown in FIG. 1 are dissolved away. As a result, the first and second side faces 320 and 322 are each formed by a single sloping face.

Figure 3C:
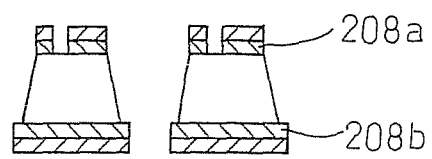

Next, as shown in FIG. 3(c), using the groove defining resist patterns 203a and 203b as masks, the etching masks 207a and 207b are etched to form an upper surface groove defining etching mask 208a and a lower surface groove defining etching mask 208b on the crystal formed in the external shape of the vibrating tines.

Figure 3D:
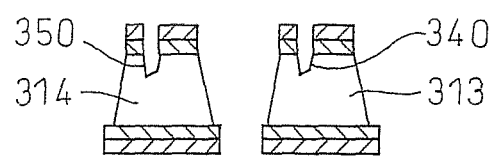

Next, as shown in FIG. 3(d), using the upper surface groove defining etching mask 208a and the lower surface groove defining etching mask 208b as masks, the crystal wafer is immersed in a hydrofluoric-acid-containing etching solution, thus etching grooves therein to form the balance adjusting grooves 340 and 350. Here, the amount of etching of the balance adjusting grooves 340 and 350 is adjusted so that one of the principal axes of each vibrating tine becomes parallel to the X axis of the crystal to prevent the occurrence of leakage vibration.

Figure 3E:

Next, as shown in FIG. 3(e), the etching masks 208a and 208b are removed to complete the formation of the vibrating tines 313 and 314 of the crystal oscillator piece 310.

FIG. 4 is an enlarged view of one of the vibrating tines in the condition of FIG. 3(b).

As shown in FIG. 4, the top surface (upper surface) of the crystal piece, as viewed in the figure, is used as a groove forming surface 324 (see FIG. 1(b)), and the groove defining resist pattern 203a is provided with a groove forming opening 215.

When the etching angle at the first side face is denoted by $\alpha$, and the etching angle at the second side face by $\beta$, then if $\alpha<\beta$, the groove forming opening 215 is provided nearer to the first side face. This satisfies the relation a<b, where a is the distance from the first-side-face-side edge of the external shape defining etching mask to the first-side-face-side edge of the groove forming opening 215 and b is the distance from the second-side-face-side edge of the external shape defining etching mask to the second-side-face-side edge of the groove forming opening 215. On the other hand, if $\alpha>\beta$, then a>b. With this arrangement, when the balance adjusting groove 340 is formed by groove etching, the vibrating tine is balanced so as to reduce the leakage vibration to zero. The setting of the groove defining resist pattern 203a will be described in detail later.

The vibrating tine pattern in the external shape defining lower photomask 204 is made larger in width than the vibrating tine pattern in the external shape defining upper photomask 202. As a result, as shown in FIG. 4, the etching mask 207b on the lower surface is formed wider than the etching mask 207a on the upper surface. The etching mask 207b has a first protruding portion (with a first protruding amount c) at the end of the first side face on the −X side of the crystallographic axis 360 of the crystal and a second protruding portion (with a second protruding amount d) at the end of the second side face on the +X side.

As shown in FIG. 4, the first protruding amount, c, of the first protruding portion is set larger than $t \times \tan(\alpha-90°)$, that is, $c > t \times \tan(\alpha-90°)$, where $\alpha$ is the angle that a face 303 along which the crystal wafer 300 is etched (to form the first side face) makes with the upper surface and t is the thickness of the crystal wafer 300.

Similarly, the second protruding amount, d, of the second protruding portion is set larger than $t \times \tan(\beta-90°)$, that is, $d > t \times \tan(\beta-90°)$, where $\beta$ is the angle that a face 304 along which the crystal wafer 300 is etched (to form the second side face) makes with the upper surface.

Further, in the manufacturing process shown in FIGS. 2 and 3, the first protruding amount, c, of the first protruding portion is set equal to $t \times \tan(\alpha-90°)+k1$, where k1 is the amount of mask offset of the lower etching mask 207b relative to the first side face. When the accuracy of the double-side aligner used is ±p, the amount of mask offset, k1, is set larger than p, i.e., k1 >p.

More specifically, when the accuracy of the double-side aligner is ±1 μm, the amount of mask offset, k1, is set, for example, to 2 μm. If the angle ($\alpha-90°$) is about 1°, the value of the first protruding portion c[μm] is set equal to t[μm]× 0.017+2 μm. With this setting, if a positional displacement occurs between the upper and lower etching masks 207a and 207b within the accuracy of the double-side aligner, the first side face is unaffected by the positional displacement. That is, a single sloping face etched from the upper surface is formed on the first side face, and thus a residual portion of a predetermined shape is always formed on the first side face.

Similarly, in the manufacturing process shown in FIGS. 2 and 3, the second protruding amount, d, of the second protruding portion is set equal to $t \times \tan(\beta-90°)+k2$, where k2 is the amount of mask offset of the lower etching mask 207b relative to the second side face. When the accuracy of the double-side aligner used is ±p, the amount of mask offset, k2, is set larger than p, that is, k2>p.

More specifically, when the accuracy of the double-side aligner is ±1 μm, the amount of mask offset, k2, is set, for example, to 2 μm. If the angle ($\beta-90°$) is about 2°, the value of the second protruding portion d[μm] is set equal to t[μm]× 0.035+2 μm. With this setting, if a positional displacement occurs between the upper and lower etching masks 207a and 207b within the accuracy of the double-side aligner, the second side face is unaffected by the positional displacement. That is, a single sloping face etched from the upper surface is formed on the second side face, and a residual portion of a predetermined shape is always formed on the second side face.

Thus, the vibrating tine 313 of the crystal oscillator piece 310 manufactured in accordance with the manufacturing process shown in FIGS. 2 and 3 is unaffected by the positional displacement between the upper and lower etching masks 207a and 207b if the positional displacement is within the accuracy of the double-side aligner (i.e., less than 2 μm).

The etching angle $\alpha$ at the first side face 320 is about 91°, and the etching angle $\beta$ at the second side face 322 is about 92°. Accordingly, the relative difference C between the upper side edge 321a of the first side face 320 and the lower side edge 323a of the first side face 320, as measured along the width direction, is always equal to t×0.017. On the other hand, the relative difference D between the upper side edge 321b of the second side face 322 and the lower side edge 323b of the second side face 322, as measured along the width direction, is always equal to t×0.035.

In this way, the same residual portions are always formed on the respective first and second side faces 320 and 322. Furthermore, the balance adjusting groove 340 is adjusted so as to balance out the residual portions formed on the first and second side faces 320 and 322. Accordingly, one of the two principal axes of the cross section of the vibrating tine 313 of the crystal oscillator piece 310 according to the present invention is substantially parallel to the upper surface, which serves to suppress the generation of leakage vibration.

In the case of the prior art method, if a positional displacement occurs between the etching masks, both the first and second side faces are affected by it; as a result, residual portions of varying shapes are formed, giving rise to the generation of appreciable leakage vibration. By contrast, in the crystal oscillator piece 310 according to the present invention, even if a positional displacement occurs between the etching masks, residual portions of predetermined shapes are always formed on the respective first and second side faces, and the balance adjusting groove is formed which is adjusted so as to balance out the residual portions. If the etching mask position is displaced, the position of the balance adjusting groove also becomes displaced, but since the effect of the positional displacement of the balance adjusting groove is very small, a crystal oscillator piece substantially free from leakage vibration can be achieved.

In the manufacturing process shown in FIGS. 2 and 3, the etching angle $\alpha$ at the first side face has been set to about 91° and the etching angle $\beta$ at the second side face to about 92°. However, since the etching angles $\alpha$ and $\beta$ vary depending on such conditions as the cut angle of the crystal wafer and the etching conditions, the first and second protruding amounts c and d are determined in accordance with these conditions.

As shown in FIG. 4, it is preferable to form the groove forming opening so that both edges thereof are spaced inwardly away from the portion provided at the edge of the external shape defining etching mask by allowing an etching margin for side etching. The reason for this is that when the balance adjusting groove is formed within the groove forming surface after the etching, if the position of the balance adjusting groove is displaced, the volume of the balance adjusting groove does not change, which serves to avoid the possibility of substantially affecting the tilting of the principal axis. The side etching here refers to the etching that proceeds horizontally relative to the principal surface of the etching mask.

Figure 5:
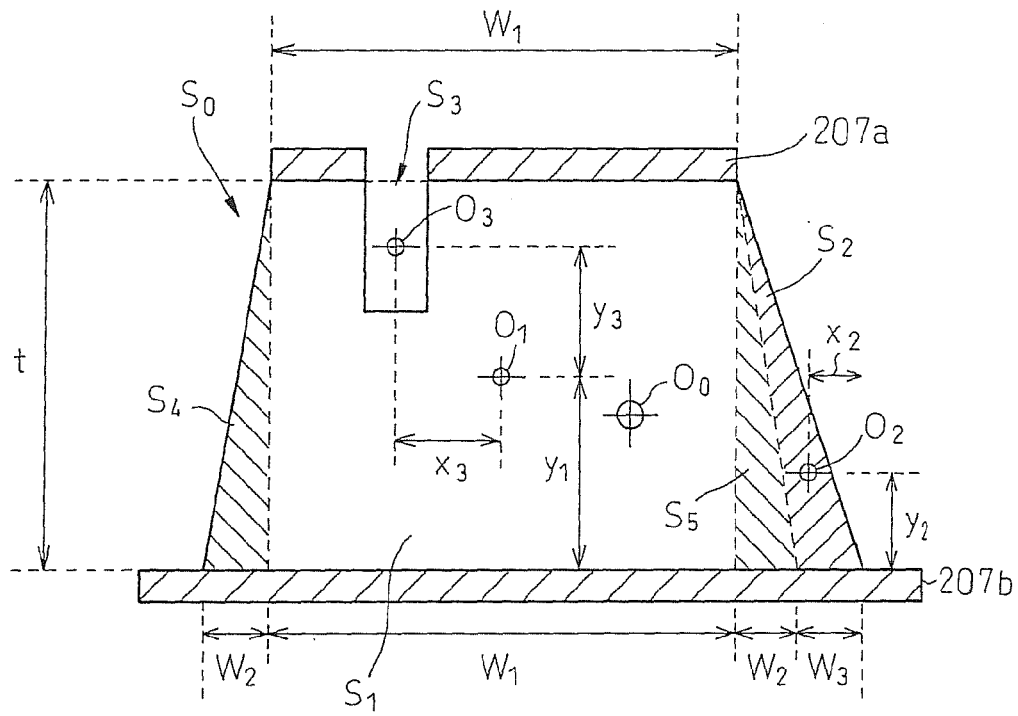
FIG. 5 is a diagram showing a vibrating tine model for explaining the optimum position, etc. of a balance adjusting groove.

FIG. 5 is a diagram showing a vibrating tine model for explaining the optimum position, etc., of the balance adjusting groove.

The orientations of the principal axes of the vibrating tine cross section are determined by the cross-sectional shape of the vibrating tine. More specifically, if the product of inertia of the vibrating tine cross section, with respect to a rectangular coordinate system having its origin at the centroid of the vibrating tine cross section and its horizontal axis parallel to the X axis, is nearly zero, then the vibrating tine cross section has a principal axis substantially parallel to the X axis. Considering this, a method for designing the balance adjusting groove so that the vibrating tine cross section will have a principal axis substantially parallel to the X axis will be described below based on the vibrating tine cross section shown in FIG. 5.

First, the vibrating tine cross section is divided into a line symmetrical trapezoidal portion $S_1$ (top side $W_1$, bottom side $(W_2+W_1+W_2)$, height t), a triangular portion $S_2$ (bottom side $W_3$, height t), and a balance adjusting groove portion $S_3$.

The cross section of the balance adjusting groove is not precisely rectangular due to the characteristics of the crystal, etc., but in the illustrated example, it is assumed to be rectangular for ease of calculation. The left-side triangular portion $S_4$ contained in the trapezoidal portion $S_1$ corresponds to the first residual portion formed on the first side face 320 in FIG. 1. Further, the right-side triangular portions $S_5$ and $S_2$ contained in the trapezoidal portion $S_1$ together correspond to the second residual portion formed on the second side face 322 in FIG. 1.

Let $O_0$ denote the centroid of the entire cross section of the vibrating tine model, $M'_0$ the product of inertia of the cross section, $O_1$ the centroid of the trapezoidal portion $S_1$, $M_1$ the product of inertia of the cross section with respect to $O_1$, $O_2$ the centroid of the triangular portion $S_2$, $M_2$ the product of inertia of the cross section with respect to $O_1$, $O_3$ the centroid of the balance adjusting groove portion, and $M_3$ the product of inertia of the cross section with respect to $O_1$. Further, coordinate axes (horizontal axis x and vertical axis y) for calculation purposes are defined in the rectangular coordinate system having its origin at the centroid $O_1$ of $S_1$ and its horizontal axis parallel to the X axis of the crystal piece. This coordinate system will hereinafter be referred to as the designated coordinate system.

The area $A_1$ of the trapezoidal portion $S_1$ is given by $t(W_1+W_2)$, and the distance $y_1$ from the centroid $O_1$ to the bottom side of the trapezoidal portion $S_1$ is given by $(t/3)((2W_2+3W_1)/(2W_2+2W_1))$. Since the trapezoidal portion $S_1$ is a line symmetrical figure, the product of inertia of the cross section, $M_1$, with respect to $O_1$ is 0.

The area $A_2$ of the triangular portion $S_2$ is given by $W_3t/2$, the relative distance $x_2$ from the centroid $O_2$ to the edge of the bottom side of the vibrating tine model is given by $(2W_3+W_2)/3$, and the distance $y_2$ from the centroid $O_2$ to the bottom side is given by $t/3$. Accordingly, in the designated coordinate system, the x coordinate of the centroid $O_2$ is given by $W_1/2+(2W_2+W_3)/3$, and the y coordinate is given by $t/3(1-(2W_2+3W_1)/(2W_2+2W_1))$. The product of inertia of the cross section, $M_2'$, with respect to the centroid $O_2$ of the triangular portion $S_2$ is given by $-W_3t/72(2W_2+W_3)$. Using $M_2'$ and applying the known parallel axis theorem, the product of inertia of the cross section, $M_2$, with respect to $O_1$ is given as the following equation (1).

$$M_2 = \frac{W_3 t^2}{72}(2W_2+W_3) + \frac{W_3 t}{2} \times \left(\frac{W_1}{2}+\frac{2W_2+W_3}{3}\right) \times \quad (1)$$
$$\frac{t}{3}\left(1-\frac{2W_2+3W_1}{2W_2+2W_1}\right)$$
$$= W_3 t^2 \left(-\frac{2W_2+W_3}{72}+\frac{1}{6}\left(\frac{W_1}{2}+\frac{2W_2+W_3}{3}\right)\left(1-\frac{2W_2+3W_1}{2W_2+2W_1}\right)\right)$$

Let $A_3$ denote the area of the balance adjusting groove portion $S_3$, and $x_3$ and $y_3$ the x and y coordinates in the designated coordinate system. Further, let $M'_3$ denote the product of inertia of the cross section with respect to the centroid $O_3$ of the balance adjusting groove portion. Then, using $M'_3$ and applying the known parallel axis theorem, the product of inertia of the cross section, $M_3$, with respect to $O_1$ is given as $M'_3 - A_3 x_3 y_3$.

Since the area $A_0$ of the entire cross section of the vibrating tine model is $A_1+A_2-A_3$, it is calculated as $t(W_1+W_2)+W_3t/2-A_3$. Further, the x coordinate $x_0$ of the centroid $O_0$ of the entire cross section of the vibrating tine model in the designated coordinate system corresponds to the following equation (2), and the y coordinate $y_0$ corresponds to the following equation (3).

$$X_0 = \frac{x_1 A_1 + x_2 A_2 - x_3 A_3}{A_0} = \frac{\left(\frac{W_1}{2}+\frac{2W_2+W_3}{3}\right) \times \frac{W_3 t}{2} - x_3 A_3}{t(W_2+W_1)+\frac{W_3 t}{2} - A_3} \quad (2)$$

$$Y_0 = \frac{y_1 A_1 + y_2 A_2 - y_3 A_3}{A_0} = \frac{\frac{t}{3}\left(1-\frac{2W_2+3W_1}{2W_2+2W_1}\right) \times \frac{W_3 t}{2} - y_3 A_3}{t(W_2+W_1)+\frac{W_3 t}{2} - A_3} \quad (3)$$

The product of inertia of the entire cross section of the vibrating tine model, $M_0$, with respect to $O_1$ is expressed as $M_1+M_2-M_3$, hence the following equation (4).

$$M_0 = 0 - \frac{W_3 t^2}{72}(2W_2+W_3) + \quad (4)$$
$$\frac{W_3 t}{2} \times \left(\frac{W_1}{2}+\frac{2W_2+W_3}{3}\right) \times \frac{t}{3}\left(1-\frac{2W_2+3W_1}{2W_2+2W_1}\right) + M'_3 - A_3 x_3 y_3$$

Using $M_0$ and applying the known parallel axis theorem, the product of inertia of the entire cross section of the vibrating tine model, $M'_0$, with respect to the centroid $O_0$ is given as the following equation (5).

$$M'_0 = 0 - \frac{W_3 t^2}{72}(2W_2+W_3) + \frac{W_3 t}{2} \times \left(\frac{W_1}{2}+\frac{2W_2+W_3}{3}\right) \times \frac{t}{3} \quad (5)$$
$$\left(1-\frac{2W_2+3W_1}{2W_2+2W_1}\right) + M'_3 - A_3 x_3 y_3 - \left(\begin{array}{c} t(W_2+W_1)+ \\ \frac{W_3 t}{2} - A_3 \end{array}\right) \times$$

-continued $$\begin{pmatrix} \left(\dfrac{W_1}{2} + \dfrac{2W_2 + W_3}{3}\right) \times \dfrac{W_3 t}{2} - x_3 A_3 \\ \hline t(W_2 + W_1) + \dfrac{W_3 t}{2} - A_3 \end{pmatrix} \times$$

$$\begin{pmatrix} \dfrac{t}{3}\left(1 - \dfrac{2W_2 + 3W_1}{2W_2 + 2W_1}\right) \times \dfrac{W_3 t}{2} - y_3 A_3 \\ \hline t(W_2 + W_1) + \dfrac{W_3 t}{2} - A_3 \end{pmatrix}$$

$$= -\dfrac{W_3 t^2}{72}(2W_2 + W_3) + \dfrac{W_3 t^2}{6} \times \left(\dfrac{W_1}{2} + \dfrac{2W_2 + W_3}{3}\right)$$

$$\left(1 - \dfrac{2W_2 + 3W_1}{2W_2 + 2W_1}\right) + M'_3 - A_3 x_3 y_3 -$$

$$\begin{pmatrix} \left(\left(\dfrac{W_1}{2} + \dfrac{2W_2 + W_3}{3}\right) \times \dfrac{W_3 t}{2} - x_3 A_3\right) \times \\ \left(\dfrac{t}{3}\left(1 - \dfrac{2W_2 + 3W_1}{2W_2 + 2W_1}\right) \times \dfrac{W_3 t}{2} - y_3 A_3\right) \\ \hline t(W_2 + W_1) + \dfrac{W_3 t}{2} - A_3 \end{pmatrix}$$

The parameters $A_3$, $x_3$, and $y_3$ related to the balance adjusting groove should be determined so that $M'_0$ becomes equal to 0. Since $W_1$, $W_2$, $W_3$, and t are known, the size and optimum position of the balance adjusting groove can be obtained using the above equation (5). While FIG. 5 has been described for the case where a single balance adjusting groove is formed in the upper surface of the vibrating tine, it will be recognized that the size and the optimum position can be obtained using essentially the same calculation method, for example, when the balance adjusting groove is formed in some other surface of the vibrating tine, or when a plurality of balance adjusting grooves are formed, as will be described later.

Using the crystal oscillator piece manufacturing method according to the present invention, residual portions of predetermined shapes are always formed on the respective first and second side faces, regardless of the presence or absence of an etching mask displacement. Accordingly, when the balance adjusting groove is formed in accordance with the above design method, a crystal oscillator piece substantially free from leakage vibration can be achieved with the balance adjusting groove balancing out the residual portions. If the etching mask position is displaced, the balance adjusting groove may also be displaced from its design position, but the effect of the positional displacement of the balance adjusting groove is very small.

For example, if $W_1$=150 μm, $W_2$=3.5 μm, $W_3$=3.5 μm, t=200 μm, $A_3$=750 μm$^2$, $x_3$=−14.6 μm, and $y_3$=75.7 μm, then from the above equation (5), $M'_0$=129 μm$^4 \approx$0, achieving a situation substantially free from leakage vibration from a design point of view. The above numeric values are only examples.

The position, depth, etc., of the balance adjusting groove that achieve zero leakage vibration somewhat differ depending on various conditions. Accordingly, preliminary experiments should be conducted by variously changing the position and depth of the balance adjusting groove to determine the optimum values that achieve zero leakage vibration; by so doing, the effect of the invention can be achieved in a more reliable manner.

Figure 6:
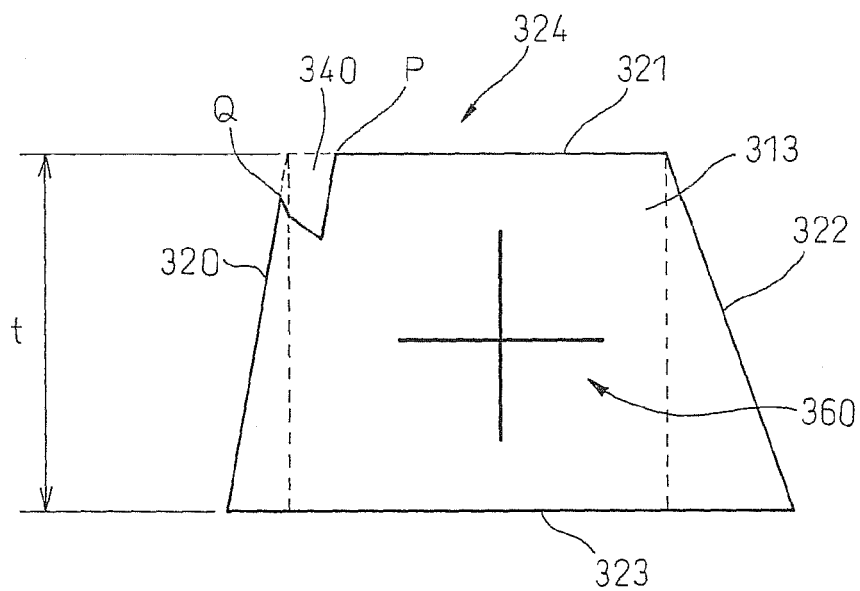
FIG. 6 is a diagram showing another crystal oscillator piece according to the present invention.

FIG. 6 is a diagram showing another crystal oscillator piece according to the present invention.

For example, when the vibrating tine is made smaller, it may become difficult to accommodate the balance adjusting groove 340 within the groove forming surface 321. In view of this, in FIG. 6, the balance adjusting groove 340 is formed in such a manner as to overlap into the first side face 320 of the vibrating tine 313. In this case, the first edge Q of the balance adjusting groove 340 is located on the first side face 320, while the second edge P is located on the upper surface 321. In the case of the crystal oscillator piece shown in FIG. 6, a positional displacement of the balance adjusting groove 340 tends to affect the tilting of the principal axis, compared with the case where the balance adjusting groove 340 is accommodated within the upper surface 321. However, in the case of the crystal oscillator piece shown in FIG. 6, the effect of the positional displacement is smaller than that of the upper/lower surface displacement of the prior art crystal oscillator piece, and thus an oscillator with reduced leakage vibration can be achieved.

FIG. 7 is a diagram for explaining how the vibrating tine shown in FIG. 6 is fabricated. FIG. 7 shows an enlarged view of one of the vibrating tines in the condition of FIG. 3(b). That is, FIG. 7 corresponds to FIG. 6, just as FIG. 4 corresponds to FIG. 1.

In the groove defining resist pattern 203a shown in FIG. 7, the groove forming opening is formed so that one edge thereof is located outside the portion provided at the edge of the external shape defining etching mask by allowing a side etching margin, while the other edge is located inwardly away from the portion provided at the edge of the external shape defining etching mask by allowing the side etching margin. With this groove defining resist pattern 203a, the balance adjusting groove 340 is formed in such a manner as to overlap from the groove forming surface 324 into the first side face 320, as shown in the cross-sectional view of the vibration tine provided in FIG. 6. While the balance adjusting groove 340 is formed overlapping from the groove forming surface 324 into the first side face in the example of FIGS. 6 and 7, the balance adjusting groove 340 may be formed in such a manner as to overlap from the groove forming surface 324 into the second side face 322.

Figure 8:
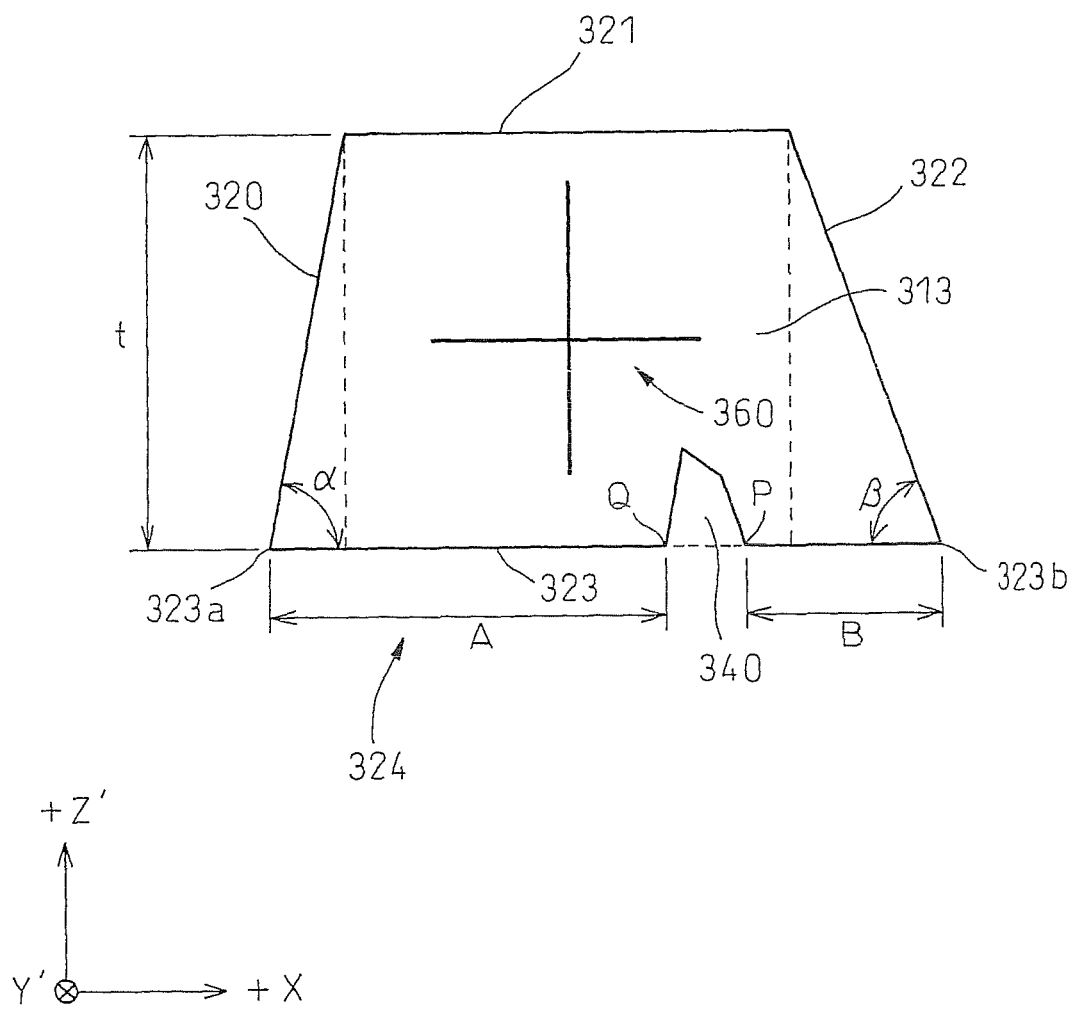
FIG. 8 is a diagram showing still another crystal oscillator piece according to the present invention.

FIG. 8 is a diagram showing still another crystal oscillator piece according to the present invention.

In the examples of FIGS. 1 and 6, the balance adjusting groove was formed in the upper surface, but instead, the balance adjusting groove 340 may be formed in the lower surface 323 of the vibrating tine 313, as shown in FIG. 8. The angle that the groove forming surface 324 makes with the first side face 320 is denoted by α, the angle that the groove forming surface 324 makes with the second side face 322 is denoted by β, the distance from the lower surface edge 323a to the balance adjusting groove edge Q is denoted by A, and the distance from the lower surface edge 323b to the balance adjusting groove edge P is denoted by B. Then, if α>β, the balance adjusting groove 340 formed in the lower surface 323 is located nearer to the second side face 322. That is, A>B. When the balance adjusting groove 340 is formed in the lower surface 323, there is offered not only the effect that one of the two dynamically perpendicular principal axes 360 passing through the centroid on a cross section taken perpendicularly to the longitudinal direction of the vibrating tine 313 is oriented substantially parallel to the upper surface 321, but also the effect that the centroid of the vibrating tine comes closer to the midpoint between the upper surface 321 and the lower surface 323, thus providing the additional effect that the vibration further stabilizes.

FIG. 9 is a diagram for explaining how the vibrating tine shown in FIG. 8 is fabricated.

FIG. 9 shows an enlarged view of one of the vibrating tines in the condition of FIG. 3(b). That is, FIG. 9 corresponds to FIG. 8, just as FIG. 4 corresponds to FIG. 1. By forming the groove defining resist pattern 203b as shown in FIG. 8, the balance adjusting groove 340 is formed in the lower surface 323. Dimension "e" of the groove defining resist pattern 203b corresponds to the distance A in FIG. 8, and dimension "f" of the groove defining resist pattern 203b corresponds to the distance B in FIG. 8. Otherwise, the structure of FIG. 9 is the same as that of FIG. 4.

Here, even when the groove forming surface 324 is located on the lower surface 323 of the vibrating tine cross section, as shown in FIGS. 8 and 9, it is preferable that the relationship between the angles α and β that the groove forming surface 324 makes with the first and second side faces and the distances A and B from the balance adjusting groove 340 to the first and second side faces is made the same as when the groove forming surface 324 is located on the upper surface 321 of the vibrating tine cross section. That is, it is preferable to satisfy the following relationships.

When $\alpha < \beta$, $A < B$, and when $\alpha > \beta$, $A > B$

Further, as in the case of FIG. 6, the balance adjusting groove 340 may be formed in such a manner as to overlap from the groove forming surface 324 into the first or second side face 320 or 322.

FIG. 10 is a diagram showing yet another crystal oscillator piece according to the present invention.

In the examples of FIGS. 1 and 6, the balance adjusting groove was formed in the upper surface, but instead, the balance adjusting groove 340 may be formed in the first side face 320 of the vibrating tine 313, as shown in FIG. 10. Alternatively, the balance adjusting groove 340 may be formed in the second side face 322.

Figure 11A:
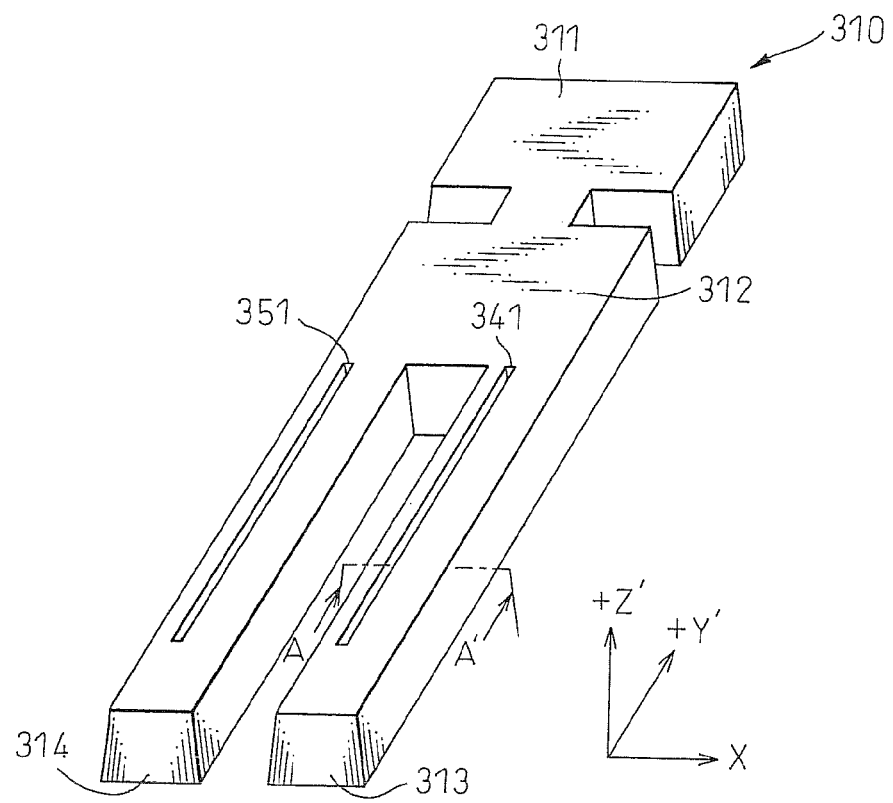
FIG. 11(a) is a perspective view showing an alternative crystal oscillator according to the present invention.
Figure 11B:
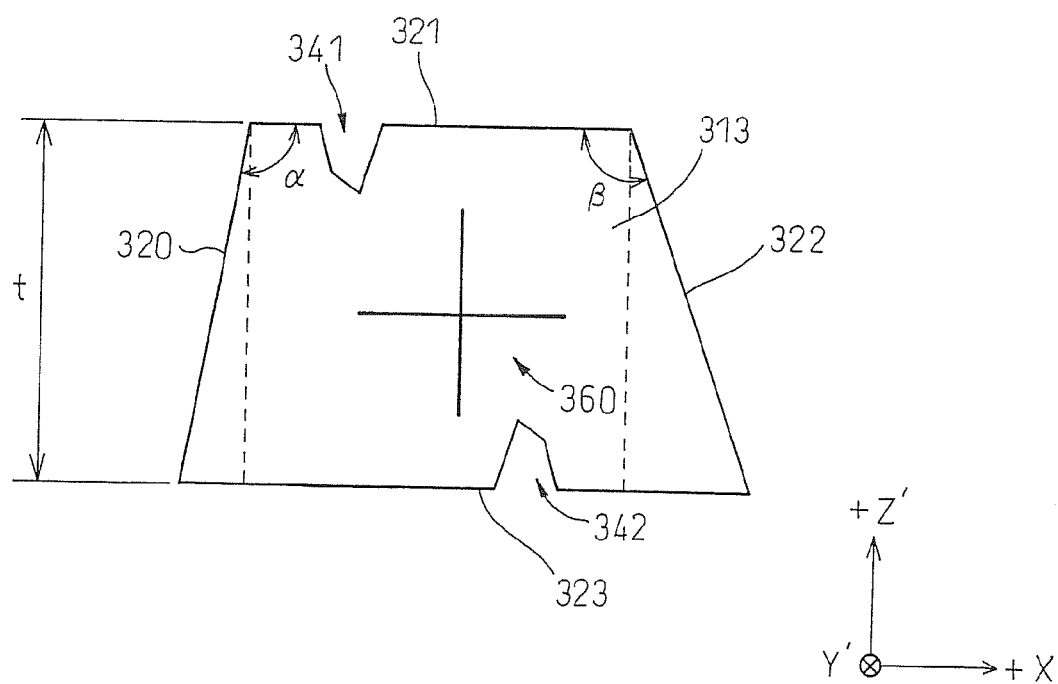
FIG. 11(b) is an enlarged view of a cross section taken along line A-A' in FIG. 11(a).

FIG. 11(a) is a perspective view showing an alternative crystal oscillator according to the present invention, and FIG. 11(b) is an enlarged view of a cross section taken along line A-A' in FIG. 11(a).

FIG. 11 shows an example in which a single balance adjusting groove is formed in the lower surface as well as the upper surface of each of the vibrating tines 313 and 314. That is, a balance adjusting groove 341 is formed in the upper surface 321 of the vibrating tine 313, and a balance adjusting groove 342 is formed in the lower surface 323 thereof; likewise, a balance adjusting groove 351 is formed in the upper surface of the vibrating tine 314, and a balance adjusting groove 352 (not shown) is formed in the lower surface thereof.

Figure 12A:
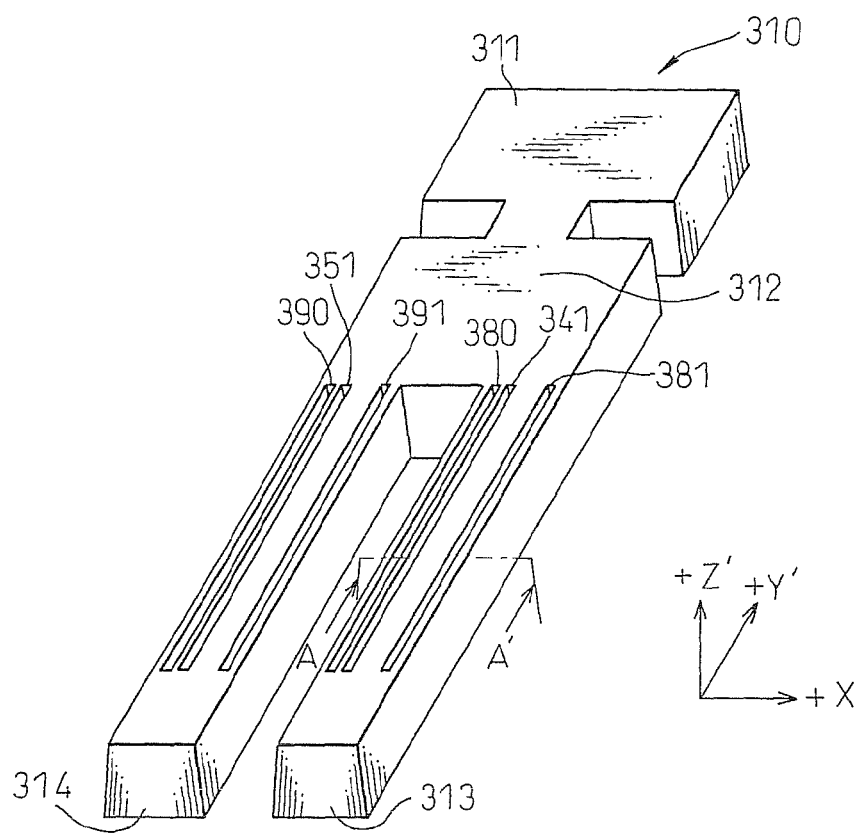
FIG. 12(a) is a perspective view showing another alternative crystal oscillator according to the present invention.
Figure 12B:
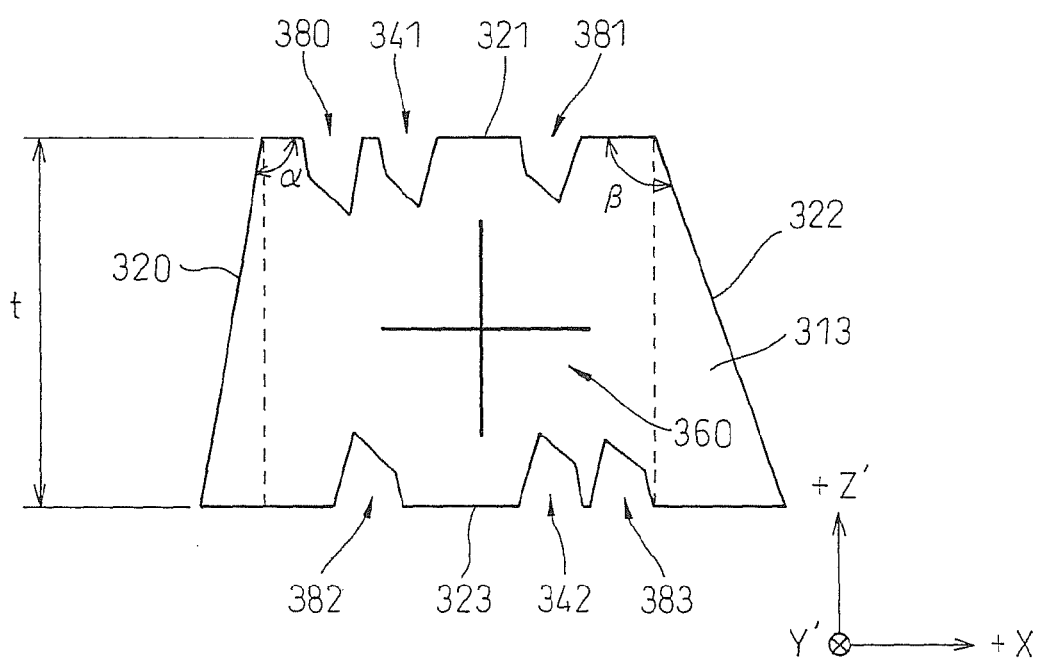
FIG. 12(b) is an enlarged view of a cross section taken along line A-A' in FIG. 12(a).

FIG. 12(a) is a perspective view showing another alternative crystal oscillator according to the present invention, and FIG. 12(b) is an enlarged view of a cross section taken along line A-A' in FIG. 12(a).

FIG. 12 shows an example in which, when electric field forming grooves are formed in the upper and lower surfaces of each of the vibrating tines 313 and 314, balance adjusting grooves are formed in the respective surfaces. More specifically, the balance adjusting groove 341 is formed in the upper surface 321 of the vibrating tine 313 in addition to the electric field forming grooves 380 and 381 formed therein, and the balance adjusting groove 342 is formed in the lower surface 323 of the vibrating tine 313 in addition to the electric field forming grooves 382 and 383 formed therein. Likewise, the balance adjusting groove 351 is formed in the upper surface of the vibrating tine 314 in addition to the electric field forming grooves 390 and 391 formed therein, and a similar balance adjusting groove is formed in the lower surface of the vibrating tine 314 in addition to the electric field forming grooves formed therein.

The number of balance adjusting grooves need not be limited to 1, but as shown in FIGS. 11 and 12, the vibrating tines may each be provided with a plurality of balance adjusting grooves according to the characteristics and conditions of the crystal oscillator.

Figure 13A:
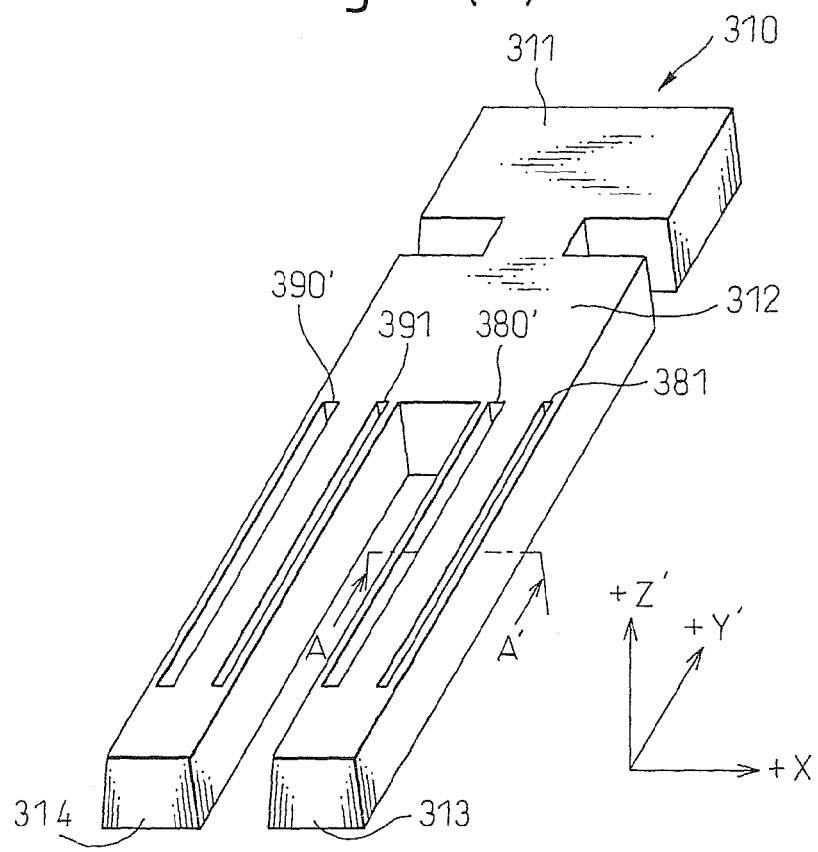
FIG. 13(a) is a perspective view showing still another alternative crystal oscillator according to the present invention.
Figure 13B:
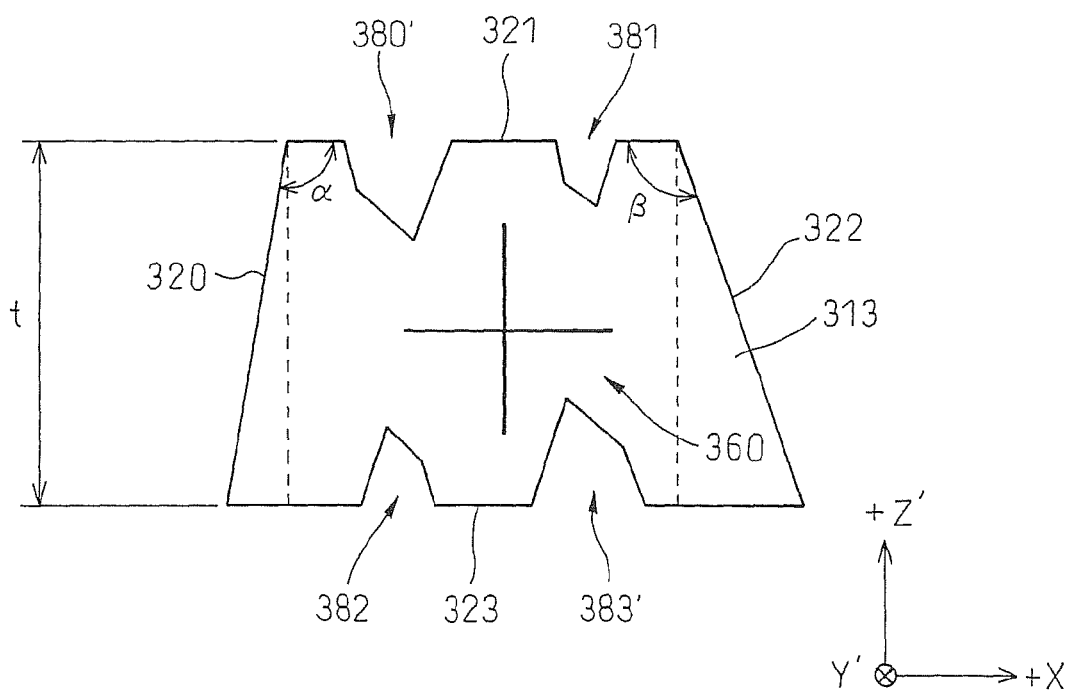
FIG. 13(b) is an enlarged view of a cross section taken along line A-A' in FIG. 13(a).
Figure 15:
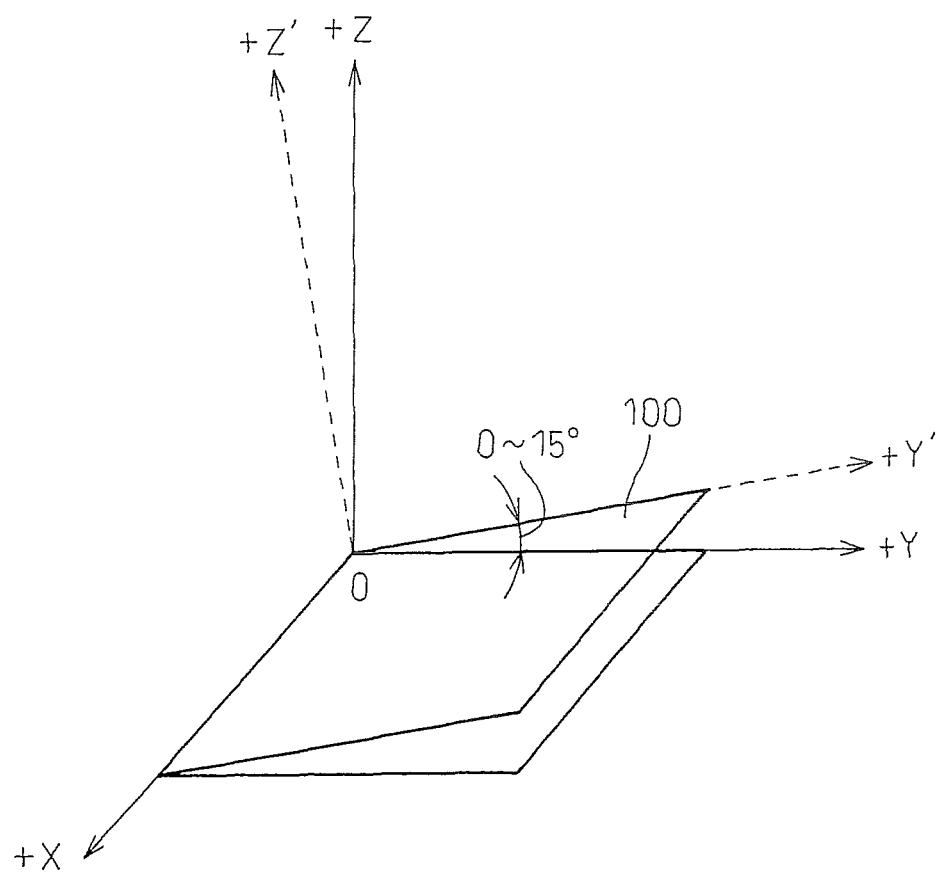
FIG. 15 is a diagram showing a crystal wafer.
Figure 16A:
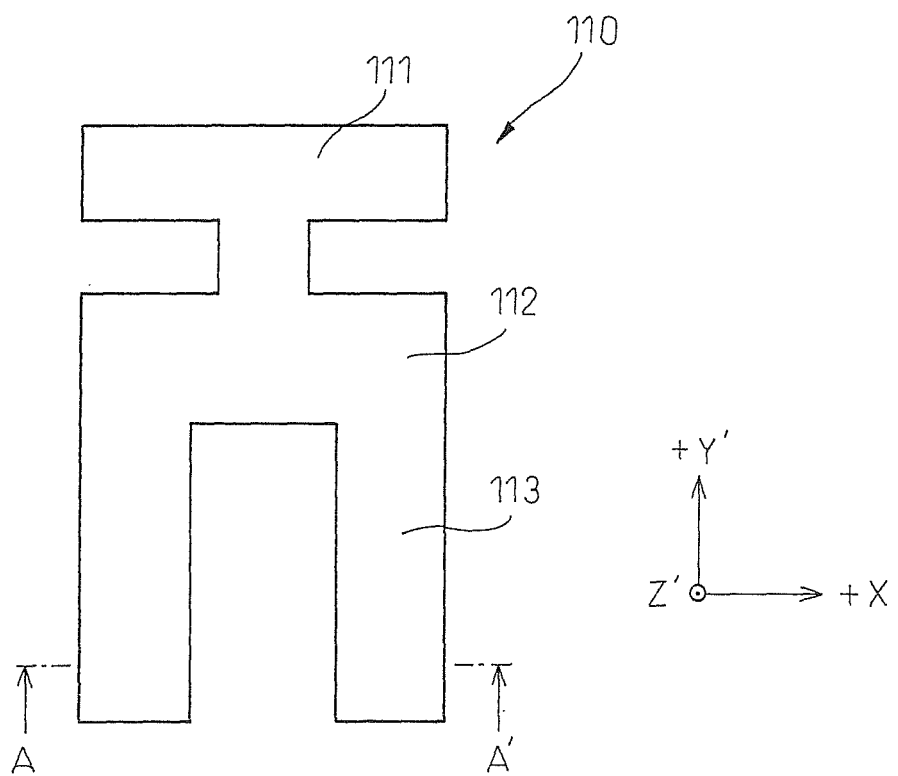
FIG. 16(a) is a plan view of a crystal oscillator piece.
Figure 16B:
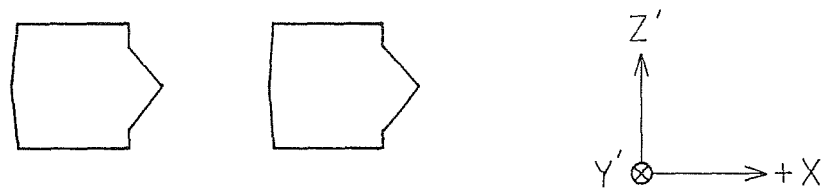
FIG. 16(b) is a diagram showing one example of a cross-sectional view taken along line A-A' in FIG. 16(a)
Figure 16C:
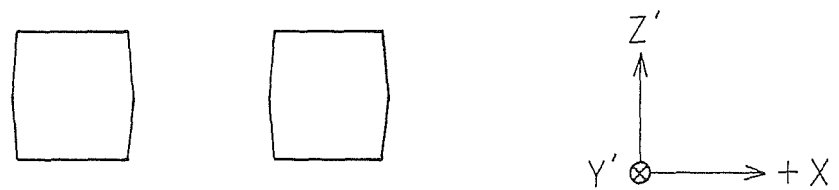
FIG. 16(c) is a diagram showing another example of a cross-sectional view taken along line A-A' in FIG. 16(a).
Figure 17:
FIGS. 17(a) to 17(e) are process diagrams showing in cross section the manufacturing steps of a crystal oscillator piece according to the prior art.
Figure 17:
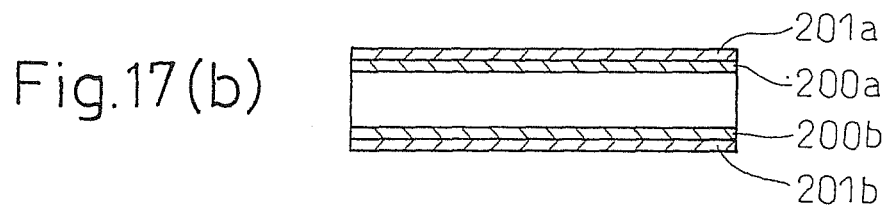
Figure 17:
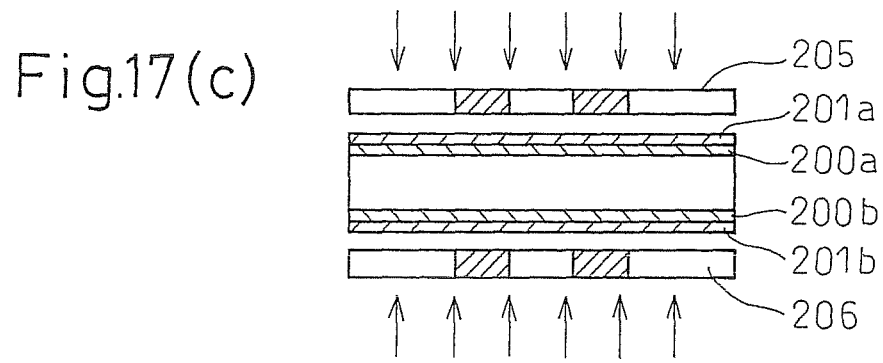
Figure 17:
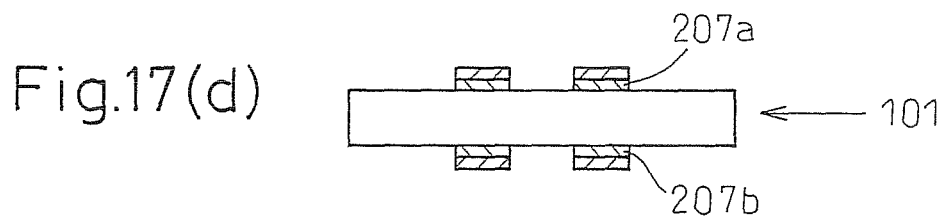
Figure 17:
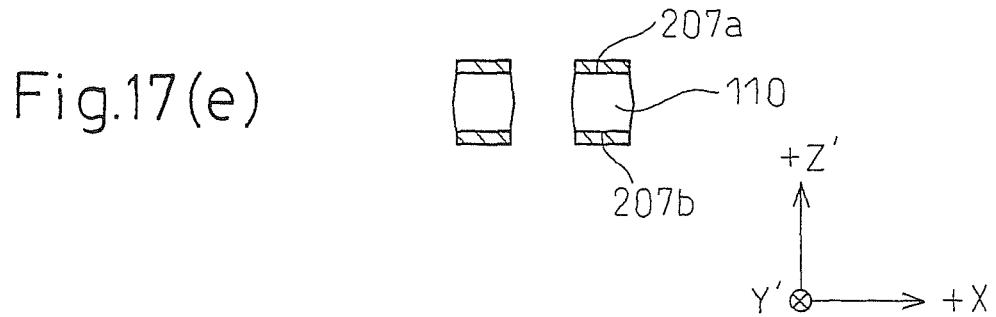
Figure 18:
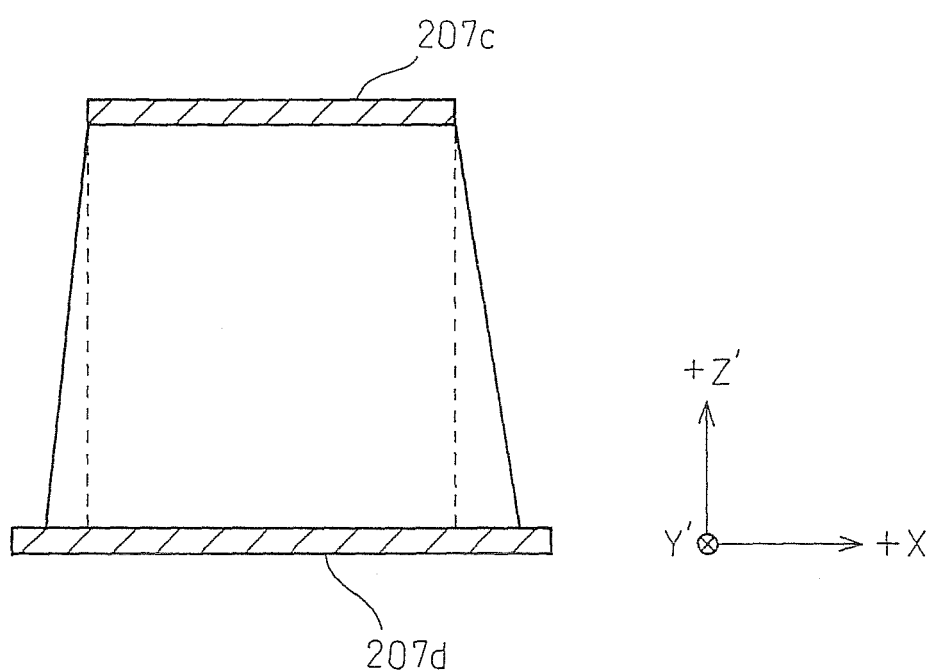
FIG. 18 is a cross-sectional view of a vibrating tine of the crystal oscillator piece according to the prior art.
Figure 19A:
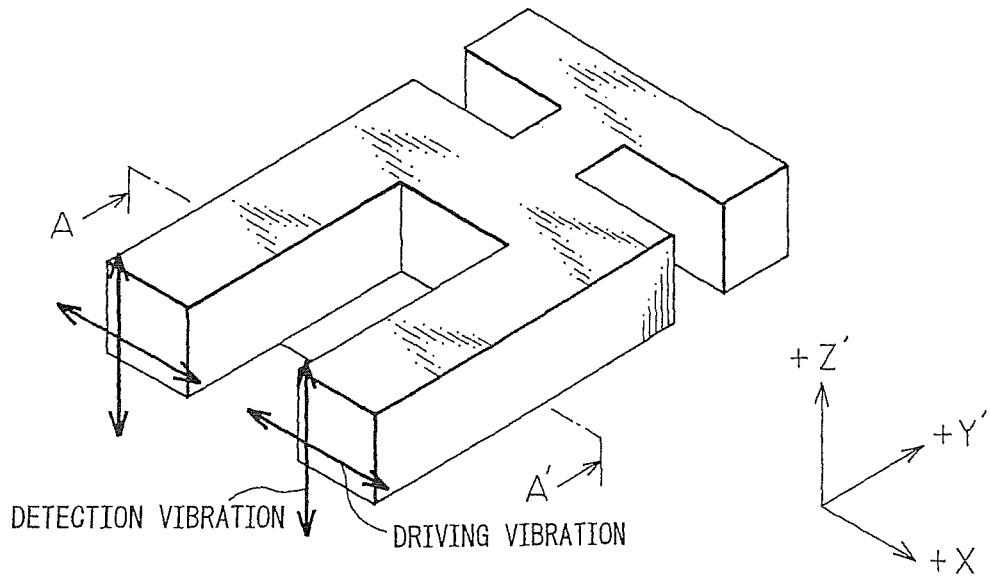
FIG. 19(a) is a perspective view of the crystal oscillator piece.
Figure 19B:
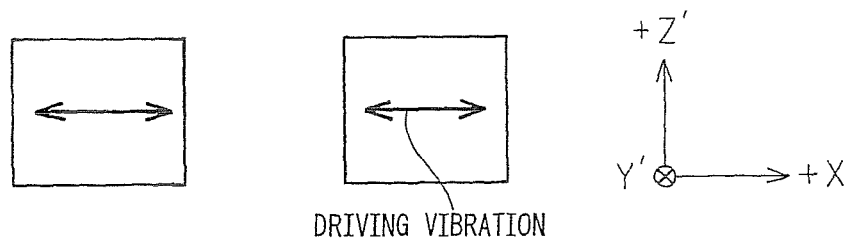
FIG. 19(b) is a diagram showing one example of the direction of vibration in an A-A' cross section of FIG. 19(a)
Figure 19C:
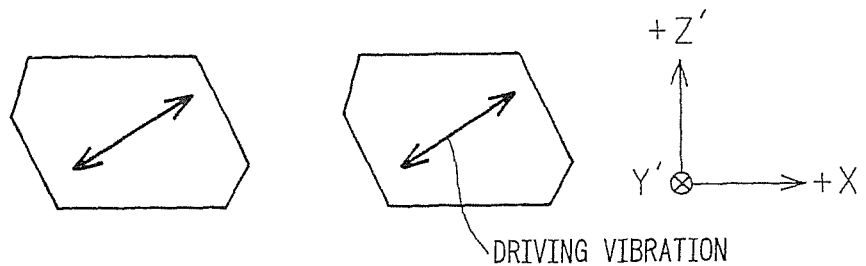
FIG. 19(c) is a diagram showing another example of the direction of vibration in the A-A' cross section of FIG. 19(a).
Figure 20A:
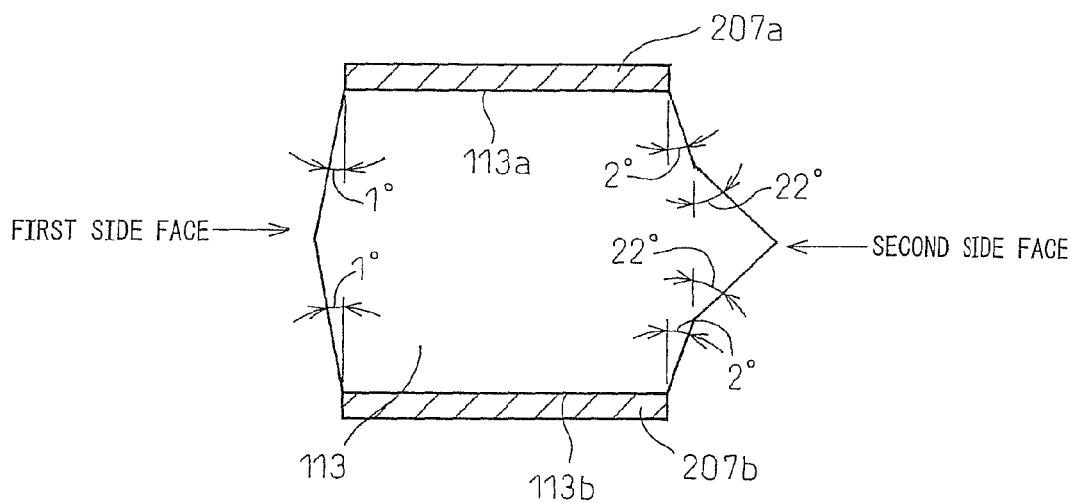
FIG. 20(a) is a cross-sectional view showing one example of crystal etching residual portion formation.
Figure 20B:
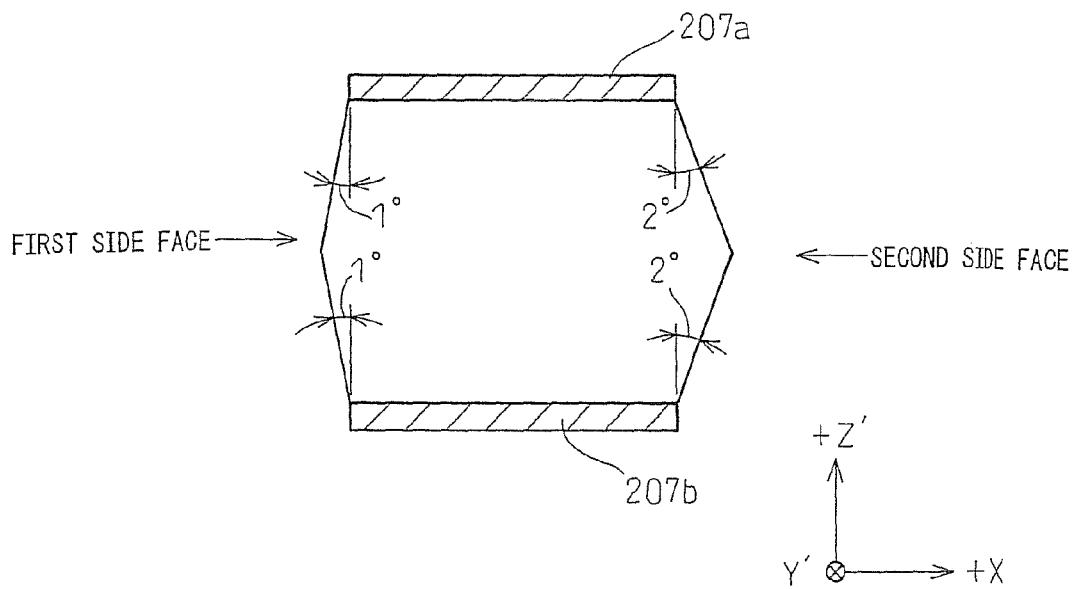
FIG. 20(b) is a cross-sectional view showing another example of crystal etching residual portion formation.
Figure 21A:
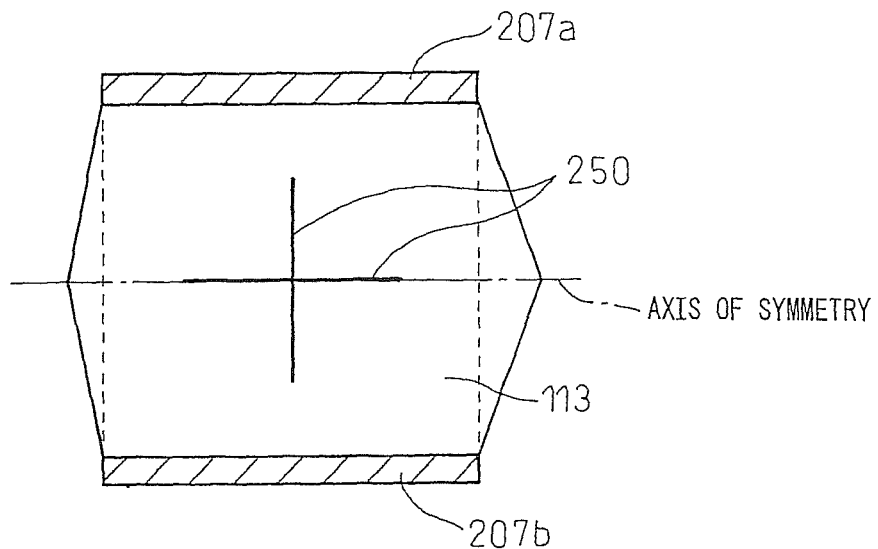
FIG. 21(a) is a cross-sectional view of the vibrating tine when there is no etching mask displacement.
Figure 21B:
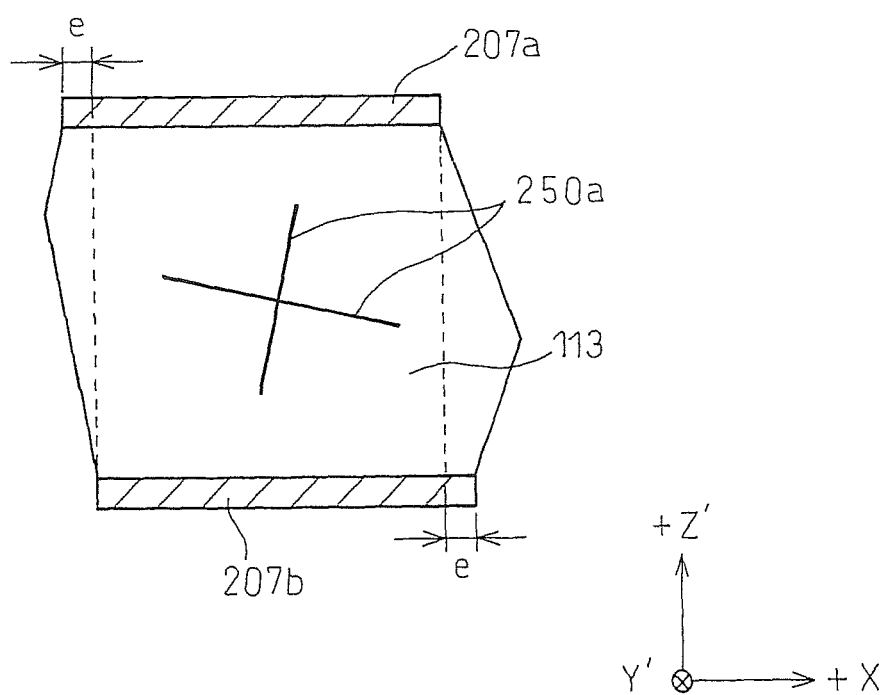
FIG. 21(b) is a cross-sectional view of the vibrating tine when an etching mask displacement occurs.
Figure 22A:
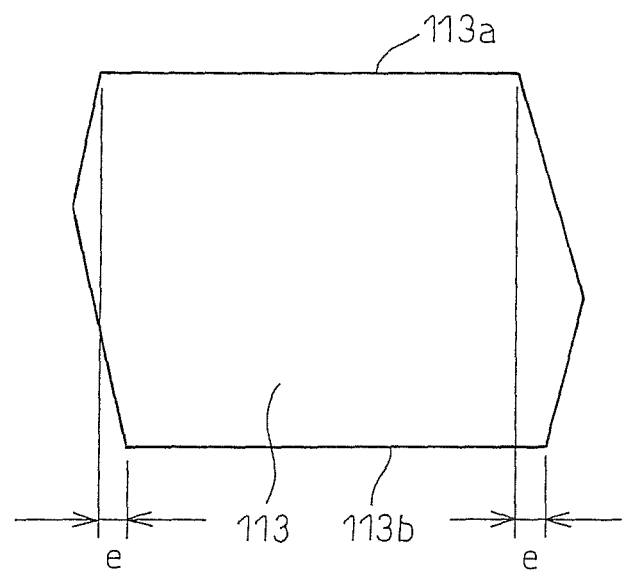
FIG. 22(a) is a diagram showing a positional displacement between the upper and lower surfaces in the cross section of the vibrating tine.
Figure 22B:
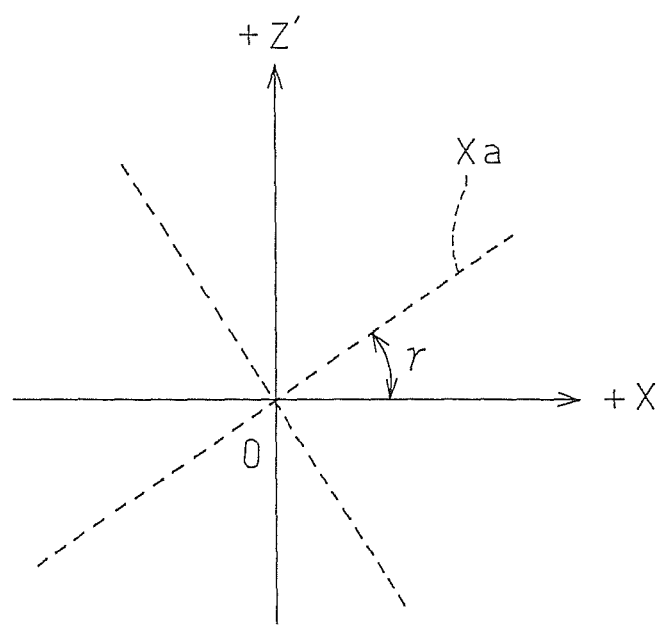
FIG. 22(b) is a diagram showing the angle of displacement of a principal axis in the cross section of the vibrating tine of FIG. 22(a).
Figure 23:
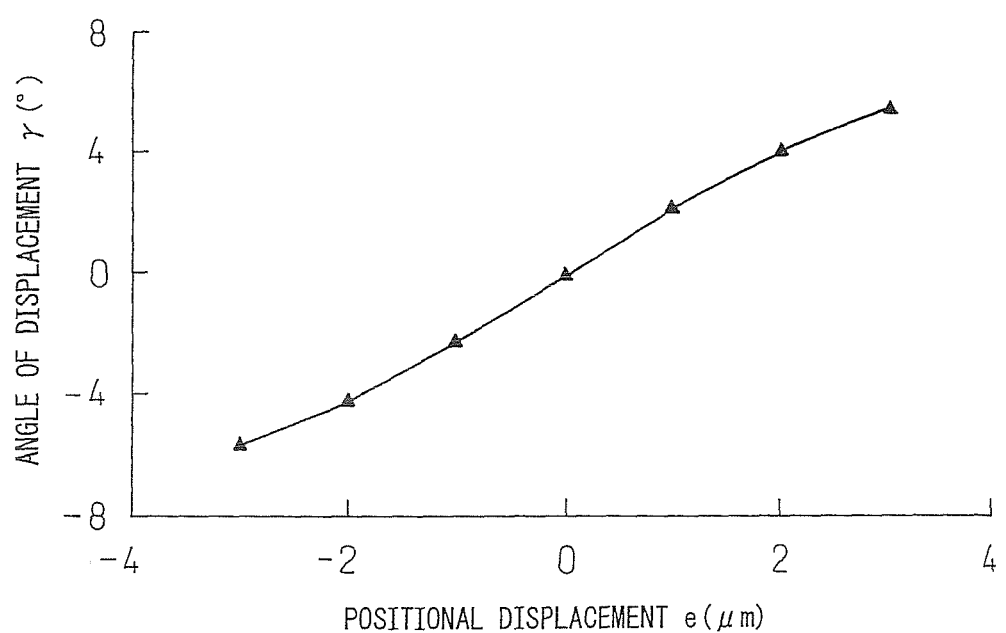
FIG. 23 is a diagram showing the relationship between the angle of displacement of the principal axis and the positional displacement occurring between upper and lower etching masks during the manufacturing process of the crystal oscillator piece.

FIG. 13(a) is a perspective view showing still another alternative crystal oscillator according to the present invention, and FIG. 13(b) is an enlarged view of a cross section taken along line A-A' in FIG. 13(a).

FIG. 13 shows an example in which some of the electric field forming grooves formed in the upper and lower surfaces of each of the vibrating tines 313 and 314 are made to also function as balance adjusting grooves by adjusting their cross-sectional areas. More specifically, the electric field forming groove 380' formed in the upper surface 321 of the vibrating tine 313 and the electric field forming groove 383' formed in the lower surface 323 are made to also function as balance adjusting grooves by enlarging their cross sections. Likewise, the electric field forming groove 390' formed in the upper surface of the vibrating tine 314 and a similar electric field forming groove formed in the lower surface are made to also function as balance adjusting grooves by enlarging their cross sections.

FIG. 14 is a diagram showing yet another alternative crystal oscillator piece according to the present invention.

Each of the above examples has been described for the case where the second side face 322 is formed from a single sloping face. However, when the thickness t is large, it takes time to etch the side face. In view of this, the second side face 322 may be formed from two sloping faces (322a and 322b), as shown in FIG. 14. When the second side face 322 is formed from two sloping faces, the relative difference between the upper side edge 321b and lower side edge 323b of the second side face correspondingly increases to D', and account has to be taken of the fact that the amount of the residual portion formed on the second side face also increases. Even when the second side face 322 is formed from two sloping faces, if the etching time is kept constant, the amount of the residual portion formed on the second side face can also be kept constant, and therefore the generation of leakage vibration can be prevented by providing the balance adjusting groove as earlier described.

As described above, the balance adjusting groove may be formed in the upper surface 321 of the vibrating tine 313 (see FIGS. 1 and 6) or in the lower surface 323 (see FIG. 8) or in the first side face 320 or the second side face 322 (see FIG. 10).

Alternatively, the balance adjusting groove may be formed in each of the upper and lower surfaces 321 and 323 of the vibrating tine 313 (see FIGS. 11 to 13), and the number of balance adjusting grooves to be formed and their size can be freely chosen. When the balance adjusting groove is formed in each of the upper and lower surfaces 321 and 323 of the vibrating tine 313, since the upper and lower balance adjusting grooves together work to provide the balance adjusting effect, the volume of each groove can be reduced, which is advantageous in terms of size. Further, the balance adjusting groove may be formed so as to extend along the entire longitudinal length of the vibrating tine or partially along the length thereof.

Furthermore, the etching for forming the external shape of the vibrating tine and the balance adjusting groove may be performed using separate etching masks, i.e., the external shape defining etching mask and the groove defining etching mask, as shown in the present embodiment, or alternatively, it may be performed using an etching mask that serves as an external shape defining etching mask as well as a groove defining etching mask.

While the present invention has been described above by taking the two tines tuning fork crystal oscillator piece as an example, it will be appreciated that the present invention can also be applied to other types of crystal oscillator piece than the two tines type, for example, to a crystal oscillator piece of a single tine type, three tines type, four tines type, or five tines type.

Further, the crystal oscillator piece according to the present invention is also applicable as a crystal oscillator for use as a frequency standard. In this case, since the leakage vibration is suppressed, there is offered the additional effect that the crystal impedance is held low.

What is claimed is:

1. A method for manufacturing a crystal oscillator piece which includes a vibrating tine having an upper surface, a lower surface, a first side face and a second side face, comprising the steps of:
    forming said vibrating tine by etching so as to remain predetermined residual portions on said first and second side faces; and
    forming a balance adjusting groove at said vibrating tine, on the basis of shapes of said residual portions formed on said first and second side faces so that at least one of two dynamically principal axes passing through a centroid on a cross section taken perpendicularly to a longitudinal direction of said vibrating tine becomes substantially parallel to said upper surface or said lower surface.

2. The method according to claim 1, wherein said residual portions formed on said first and second side faces are formed by etching from one direction.

3. The method according to claim 1, wherein said vibrating tine is formed so that width of said vibrating tine gradually increases from said upper surface toward said lower surface having a larger width than said upper surface.

4. The method according to claim 3, wherein an external shape defining upper etching mask is formed on the upper surface of a crystal wafer, and an external shape defining lower etching mask having a larger width than said external shape defining upper etching mask is formed on the lower surface of said crystal wafer, and
    wherein said external shape defining upper etching mask and said external shape defining lower etching mask are formed so as to satisfy the relationships $c > t \times \tan(\alpha - 90°)$ $d > t \times \tan(\beta - 90°)$ where c is the length of a first protruding portion by which said external shape defining lower etching mask protrudes relative to said external shape defining upper etching mask from a position corresponding to an upper side edge of said first side face, d is the length of a second protruding portion by which said external shape defining lower etching mask protrudes relative to said external shape defining upper etching mask from a position corresponding to an upper side edge of said second side face, t is the thickness of said crystal wafer, $\alpha$ is an etching angle at said first side face, and $\beta$ is an etching angle at said second side face.

5. The method according to claim 4, wherein when the accuracy of alignment between said external shape defining upper etching mask and said external shape defining lower etching mask is ±p, the amount of mask offset of said external shape defining lower etching mask relative to said first side face k1, and the amount of mask offset of said external shape defining lower etching mask relative to said second side face is k2, said external shape defining upper etching mask and said external shape defining lower etching mask are formed so as to satisfy the relationships $c = t \times \tan(\alpha - 90°) + k1$ $d = t \times \tan(\beta - 90°) + k2$ k1 > p and k2 > p.

6. The method according to claim 4, wherein a groove defining etching mask having a groove forming opening for forming said balance adjusting groove is formed on at least either one of said upper and lower surfaces, and wherein said groove defining etching mask is formed so as to satisfy the relationships when $\alpha < \beta$, $a < b$, and when $\alpha > \beta$, $a > b$ where a is the distance from said groove forming opening to said first side face, and b is the distance from said groove forming opening to said second side face.

7. The method according to claim 6, wherein when a surface in which said balance adjusting groove is formed is designated as a groove forming surface, said balance adjusting groove is formed within said groove forming surface.

8. The method according to claim 6, wherein when a surface in which said balance adjusting groove is formed is designated as a groove forming surface, said balance adjusting groove is formed in such a manner as to overlap from said groove forming surface into said first side face or said second side face.

9. A method for manufacturing a crystal oscillator piece which includes a vibrating tine having an upper surface, a lower surface, a first side face and a second side face, comprising the steps of:
    forming said vibrating tine by etching so as to remain predetermined residual portions on said first and second side faces; and
    forming a balance adjusting groove at said vibrating tine so as to correspond to shapes of said residual portions formed on said first and second side faces,
    wherein said vibrating tine is formed so that width of said vibrating tine gradually increases from said upper surface toward said lower surface having a larger width than said upper surface,
    wherein an external shape defining upper etching mask is formed on the upper surface of a crystal wafer, and an external shape defining lower etching mask having a larger width than said external shape defining upper etching mask is formed on the lower surface of said crystal wafer,
    wherein said external shape defining upper etching mask and said external shape defining lower etching mask are formed so as to satisfy the relationships $c > t \times \tan(\alpha - 90°)$ $d > t \times \tan(\beta - 90°)$ where c is the length of a first protruding portion by which said external shape defining lower etching mask protrudes relative to said external shape defining upper etching mask from a position corresponding to an upper side edge of said first side face, d is the length of a second protruding portion by which said external shape defining lower etching mask protrudes relative to said external shape defining upper etching mask from a position corresponding to an upper side edge of said second side face, t is the thickness of said crystal wafer, α is an etching angle at said first side face, and β is an etching angle at said second side face, and wherein a groove defining etching mask having a groove forming opening for forming said balance adjusting groove is formed on at least either one of said upper and lower surfaces, and wherein said groove defining etching mask is formed so as to satisfy the relationships when $\alpha<\beta$, $a<b$, and when $\alpha>\beta$, $a>b$ where a is the distance from said groove forming opening to said first side face, and b is the distance from said groove forming opening to said second side face.

10. A method for manufacturing a crystal oscillator piece which includes a vibrating tine having an upper surface, a lower surface, a first side face and a second side face, comprising the steps of:

forming an external shape defining upper etching mask on the upper surface of a crystal wafer;

forming an external shape defining lower etching mask having a larger width than said external shape defining upper etching mask on the lower surface of said crystal wafer;

forming said vibrating tine by etching the crystal wafer, on which the external shape defining upper etching mask and said external shape defining lower etching mask are formed, whereby said vibrating tine is formed so that width of said vibrating tine gradually increases from said upper surface toward said lower surface having a larger width than said upper surface and; and forming a balance adjusting groove at said vibrating tine on the basis of shapes of residual portions formed on said first and second side faces so that at least one of two dynamically principal axes passing through a centroid on a cross section taken perpendicularly to a longitudinal direction of said vibrating tine becomes substantially parallel to said upper surface or said lower surface.

* * * * *